US011895867B2

(12) United States Patent
Sui et al.

(10) Patent No.: US 11,895,867 B2
(45) Date of Patent: Feb. 6, 2024

(54) METHOD OF REDUCING COLOR BREAKUP OF REFLECTION OF AMBIENT LIGHT IN DISPLAY PANEL, DISPLAY PANEL, DISPLAY APPARATUS, AND METHOD OF FABRICATING DISPLAY PANEL

(71) Applicant: BOE Technology Group Co., Ltd., Beijing (CN)

(72) Inventors: Kai Sui, Beijing (CN); Zhongyuan Sun, Beijing (CN); Yupeng Gao, Beijing (CN); Chao Dong, Beijing (CN); Chuanxiang Xu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 696 days.

(21) Appl. No.: 17/047,925

(22) PCT Filed: Dec. 17, 2019

(86) PCT No.: PCT/CN2019/125935
§ 371 (c)(1),
(2) Date: Oct. 15, 2020

(87) PCT Pub. No.: WO2021/119992
PCT Pub. Date: Jun. 24, 2021

(65) Prior Publication Data
US 2023/0116030 A1  Apr. 13, 2023

(51) Int. Cl.
*H10K 50/858* (2023.01)
*H10K 59/40* (2023.01)
(Continued)

(52) U.S. Cl.
CPC ......... *H10K 50/858* (2023.02); *H10K 50/856* (2023.02); *H10K 50/865* (2023.02);
(Continued)

(58) Field of Classification Search
CPC .. H10K 50/858; H10K 50/865; H10K 50/856; H10K 59/40; H10K 71/60; H10K 59/122; H10K 59/35; H10K 59/38
(Continued)

(56) References Cited

U.S. PATENT DOCUMENTS

| | | | |
|---|---|---|---|
| 2012/0286300 A1* | 11/2012 | Kijima | H10K 50/858 |
| | | | 257/E51.018 |
| 2019/0123111 A1 | 4/2019 | Jin et al. | |
| 2019/0189968 A1 | 6/2019 | Song | |

FOREIGN PATENT DOCUMENTS

| | | |
|---|---|---|
| CN | 107799572 A | 3/2018 |
| CN | 109119453 A | 1/2019 |

(Continued)

OTHER PUBLICATIONS

Zhang, OLED Display Panel And Display Device, Published Oct. 11, 2019, English translation by PE2E (Year: 2019).*
(Continued)

*Primary Examiner* — Tu-Tu V Ho
(74) *Attorney, Agent, or Firm* — Intellectual Valley Law, P.C.

(57) ABSTRACT

A method of reducing color breakup of reflection of ambient light in a display panel having a color breakup-prevention structure is provided. The color breakup-prevention structure includes a high refractive index lens layer on a side of a plurality of light emitting elements away from a base substrate; a low refractive index modulation layer on a side of the high refractive index lens layer away from the base substrate; a first color filter layer in a plurality of subpixel regions, and spaced apart from the high refractive index lens layer by the low refractive index modulation layer; and a first black matrix layer in an inter-subpixel region, and spaced apart from the high refractive index lens layer by the low refractive index modulation layer. The high refractive
(Continued)

index lens layer includes a plurality of lens portions spaced apart from each other and respectively in the plurality of subpixels.

18 Claims, 19 Drawing Sheets

(51) Int. Cl.
  *H10K 71/60* (2023.01)
  *H10K 59/122* (2023.01)
  *H10K 59/35* (2023.01)
  *H10K 59/38* (2023.01)
  *H10K 50/86* (2023.01)
  *H10K 50/856* (2023.01)

(52) U.S. Cl.
  CPC ........... *H10K 59/122* (2023.02); *H10K 59/35* (2023.02); *H10K 59/38* (2023.02); *H10K 59/40* (2023.02); *H10K 71/60* (2023.02)

(58) Field of Classification Search
  USPC .......................................................... 257/40
  See application file for complete search history.

(56) References Cited

FOREIGN PATENT DOCUMENTS

| | | |
|---|---|---|
| CN | 110323353 A | 10/2019 |
| CN | 110323354 A | 10/2019 |
| CN | 110429111 A | 11/2019 |
| KR | 20150121402 A | 10/2015 |
| WO | 2011129381 A1 | 10/2011 |

OTHER PUBLICATIONS

First Office Action in the Chinese Patent Application No. 201980003057.8, dated Jun. 2, 2021; English translation attached.

International Search Report & Written Opinion dated Sep. 22, 2020, regarding PCT/CN201/125935.

* cited by examiner

METHOD OF REDUCING COLOR BREAKUP OF REFLECTION OF AMBIENT LIGHT IN DISPLAY PANEL, DISPLAY PANEL, DISPLAY APPARATUS, AND METHOD OF FABRICATING DISPLAY PANEL

CROSS-REFERENCE TO RELATED APPLICATION

This application is a national stage application under 35 U.S.C. § 371 of International Application No. PCT/CN2019/125935, filed Dec. 17, 2019, the contents of which are incorporated by reference in the entirety.

TECHNICAL FIELD

The present invention relates to display technology, more particularly, to a method of reducing color breakup of reflection of ambient light in a display panel, a display panel, a display apparatus, and a method of fabricating a display panel.

BACKGROUND

Organic light emitting diode (OLED) display apparatuses are self-emissive devices, and do not require backlights. OLED display apparatuses also provide more vivid colors and a larger color gamut as compared to the conventional liquid crystal display (LCD) apparatuses. Further, OLED display apparatuses can be made more flexible, thinner, and lighter than a typical LCD apparatus.

SUMMARY

In one aspect, the present invention provides a method of reducing color breakup of reflection of ambient light in a display panel; wherein the display panel comprises a base substrate; a plurality of light emitting elements on the base substrate and respectively in a plurality of subpixels; and a color breakup-prevention structure configured to reduce color breakup of reflection of ambient light in the plurality of subpixels; wherein the color breakup-prevention structure comprises a high refractive index lens layer on a side of the plurality of light emitting elements away from the base substrate; a low refractive index modulation layer on a side of the high refractive index lens layer away from the base substrate; a first color filter layer in a plurality of subpixel regions, and spaced apart from the high refractive index lens layer by the low refractive index modulation layer; and a first black matrix layer in an inter-subpixel region, and spaced apart from the high refractive index lens layer by the low refractive index modulation layer; wherein the high refractive index lens layer has a first refractive index; the low refractive index modulation layer has a second refractive index smaller than the first refractive index; the low refractive index modulation layer is substantially transparent and substantially free of a chromogenic material; and the high refractive index lens layer comprises a plurality of lens portions spaced apart from each other and respectively in the plurality of subpixels; wherein the method of reducing color breakup of reflection of ambient light comprises refracting a first incident ambient light beam at a first interface between a respective one of the plurality of lens portions and a first medium on a side of the respective one of the plurality of lens portions away from the respective one of the plurality of light emitting elements, to generate a first refracted light beam having a direction altered from a direction of a light beam in the first medium; reflecting the first refracted light beam by a reflective structure in a respective one of the plurality of light emitting elements to generate a first reflected light beam to continue transmitting through at least the first medium, resulting in a first residual portion arriving at the first black matrix layer; and at least partially absorbing the first residual portion of the first reflected light beam by the first black matrix layer; wherein the method further comprises refracting a second incident ambient light beam at the first interface, to generate a second refracted light beam having a direction altered from the direction of the light beam in the first medium; reflecting the second refracted light beam by the reflective structure in the respective one of the plurality of light emitting elements to generate a second reflected light beam to continue transmitting through at least the first medium, resulting in a second residual portion arriving at the first color filter layer in a first adjacent subpixel adjacent to a subpixel having the respective one of the plurality of light emitting elements; and at least partially absorbing the second residual portion of the second reflected light beam by the first color filter layer in the first adjacent subpixel; wherein the first color filter layer in the first adjacent subpixel has a color different from a color of the first color filter layer in the subpixel having the respective one of the plurality of light emitting elements.

Optionally, the color breakup-prevention structure comprises a second color filter layer in the plurality of subpixel regions, and spaced apart from the low refractive index modulation layer by the high refractive index lens layer; and a second black matrix layer in the inter-subpixel region, and spaced apart from the low refractive index modulation layer by the high refractive index lens layer; wherein the method further comprises refracting a third incident ambient light beam at an interface between the high refractive index lens layer and the first medium, to generate a third refracted light beam having a direction altered from the direction of the light beam in the first medium; at least partially absorbing the third refracted light beam by the second color filter layer in the subpixel having the respective one of the plurality of light emitting elements; reflecting the third refracted light beam by the reflective structure in the respective one of the plurality of light emitting elements to generate a third reflected light beam, the third reflected light beam transmitting along a direction toward a second adjacent subpixel adjacent to the subpixel having the respective one of the plurality of light emitting elements; and at least partially absorbing the third reflected light beam by the second color filter layer in the subpixel having the respective one of the plurality of light emitting elements; wherein the first color filter layer in the second adjacent subpixel has a color different from a color of the second color filter layer in the subpixel having the respective one of the plurality of light emitting elements.

Optionally, the method further comprises reflecting a fourth incident ambient light beam at the first interface to generate a fourth reflected light beam, the fourth reflected light beam transmitting along a direction toward the first black matrix layer; and at least partially absorbing the fourth reflected light beam by the first black matrix layer.

Optionally, the method further comprises reflecting a fifth incident ambient light beam at the first interface to generate a fifth reflected light beam, the fifth reflected light beam transmitting along a direction toward the first color filter layer in a third adjacent subpixel adjacent to the subpixel having the respective one of the plurality of light emitting elements; and at least partially absorbing the fifth reflected light beam by the first color filter layer in the third adjacent subpixel; wherein the first color filter layer in the third adjacent subpixel has a color different from a color of the first color filter layer in the subpixel having the respective one of the plurality of light emitting elements.

Optionally, the method further comprises emitting a light beam from the respective one of the plurality of light emitting elements away from the base substrate and toward the color filter layer; and converging the light beam by at least the respective one of the plurality of lens portions, thereby enhancing light extraction efficiency of the display panel.

Optionally, the method further comprises refracting a sixth incident ambient light beam at the first interface to generate a fourth refracted light beam, the fourth refracted light beam transmitting along a direction toward a pixel definition layer defining a plurality of subpixel apertures respectively in a plurality of subpixels; and at least partially absorbing the fourth refracted light beam by the pixel definition layer; wherein the pixel definition layer is made of a light absorbing material.

Optionally, the first medium is the low refractive index modulation layer.

Optionally, prior to refracting the first incident ambient light beam at the first interface, the method further comprises refracting an incident ambient light beam at a second interface between a respective one of a plurality of cavity chambers and a second medium on a side of the respective one of the plurality of cavity chambers away from the respective one of the plurality of lens portions to generate the first incident ambient light beam; wherein the plurality of cavity chambers are spaced apart from each other, and respectively cover the plurality of lens portions; the respective one of the plurality of cavity chambers spaces apart the respective one of the plurality of lens portions from the low refractive index modulation layer; and the respective one of the plurality of cavity chambers has a third refractive index smaller than the second refractive index.

Optionally, the first medium is the plurality of cavity chambers.

Optionally, prior to refracting the first incident ambient light beam at the first interface, the method further comprises refracting an incident ambient light beam at a third interface between a respective one of a plurality of intermediate lens portions and a third medium on a side of the respective one of the plurality of intermediate lens portions away from the respective one of the plurality of lens portions, to generate the first incident ambient light beam; wherein an intermediate refractive index lens layer comprising the plurality of intermediate lens portions is between the high refractive index lens layer and the low refractive index modulation layer; the intermediate refractive index lens layer comprises the plurality of intermediate lens portions spaced apart from each other and respectively in the plurality of subpixels; and the intermediate refractive index lens layer has a fourth refractive index between the first refractive index and the second refractive index.

Optionally, the first medium is the intermediate refractive index lens layer.

In another aspect, the present invention provides a display panel, comprising a base substrate; a plurality of light emitting elements on the base substrate and respectively in a plurality of subpixels; and a color breakup-prevention structure configured to reduce color breakup of reflection of ambient light in the plurality of subpixels; wherein the color breakup-prevention structure comprises a high refractive index lens layer on a side of the plurality of light emitting elements away from the base substrate; a low refractive index modulation layer on a side of the high refractive index lens layer away from the base substrate; a first color filter layer in a subpixel region, and spaced apart from the high refractive index lens layer by the low refractive index modulation layer; and a first black matrix layer in an inter-subpixel region, and spaced apart from the high refractive index lens layer by the low refractive index modulation layer; wherein the high refractive index lens layer has a first refractive index; the low refractive index modulation layer has a second refractive index smaller than the first refractive index; the low refractive index modulation layer is substantially transparent and substantially free of a chromogenic material; and the high refractive index lens layer comprises a plurality of lens portions spaced apart from each other and respectively in the plurality of subpixels.

Optionally, the color breakup-prevention structure further comprises a second color filter layer in the subpixel region, and spaced apart from the low refractive index modulation layer by the high refractive index lens layer; and a second black matrix layer in the inter-subpixel region, and spaced apart from the low refractive index modulation layer by the high refractive index lens layer.

Optionally, the display panel further comprises an encapsulating layer encapsulating the plurality of light emitting elements; and a spacing planarization layer on a side of the encapsulating layer away from the plurality of light emitting elements; wherein the high refractive index lens layer is spaced part from the plurality of light emitting elements by the spacing planarization layer and the encapsulating layer.

Optionally, the display panel further comprises a pixel definition layer defining a plurality of subpixel apertures respectively in a plurality of subpixels; wherein the pixel definition layer is made of a light absorbing material.

Optionally, the color breakup-prevention structure further comprises a plurality of cavity chambers spaced apart from each other, and respectively covering the plurality of lens portions; wherein a respective one of the plurality of cavity chambers spaces apart a respective one of the plurality of lens portions from the low refractive index modulation layer; and the respective one of the plurality of cavity chambers has a third refractive index smaller than the second refractive index.

Optionally, the color breakup-prevention structure further comprises an intermediate refractive index lens layer between the high refractive index lens layer and the low refractive index modulation layer; wherein the intermediate refractive index lens layer comprises a plurality of intermediate lens portions spaced apart from each other and respectively in the plurality of subpixels; and the intermediate refractive index lens layer has a fourth refractive index between the first refractive index and the second refractive index.

Optionally, the intermediate refractive index lens layer and the high refractive index lens layer are in direct contact.

Optionally, the first color filter layer comprises a plurality of color filter blocks respectively in the plurality of subpixels; and a respective one of the plurality of color filter blocks has a light transmissive portion surrounded by the first black matrix layer; wherein, in a cross-section intersecting a respective one of the plurality of lens portions and a respective one of the plurality of color filter blocks in a same subpixel, the light transmissive portion has a first width $w_1$, the respective one of the plurality of lens portions has a diameter $w_2$ and a height $h$, $w_2 > w_1$, and $0.5\ w_2 < h < w_2$.

Optionally, the first refractive index is 1.85, and the second refractive index is 1.18.

Optionally, the third refractive index is 1.0.

Optionally, the display panel further comprises a third black matrix layer in the inter-subpixel region, and spaced apart from the low refractive index modulation layer by the first black matrix layer; an insulating layer between the third black matrix layer and the first black matrix layer; and a touch structure in the inter-subpixel region, and between the first black matrix layer and the third black matrix layer; wherein on a first side of the touch structure, the touch structure is covered by the first black matrix layer, and on a second side of the touch structure opposite to the first side, the touch structure is covered by the third black matrix layer; and the touch structure comprises a plurality of first touch electrodes and a plurality of second touch electrode crossing over each other.

In another aspect, the present invention provides a display apparatus, comprising the display panel described herein or fabricated by a method described herein, and one or more integrated circuit connected to the display panel.

In another aspect, the present invention provides a method of fabricating a display panel, comprising forming a plurality of light emitting elements on a base substrate and respectively in a plurality of subpixels; and forming a color breakup-prevention structure configured to reduce color breakup of reflection of ambient light in the plurality of subpixels; wherein forming the color breakup-prevention structure comprises forming a high refractive index lens layer on a side of the plurality of light emitting elements away from the base substrate; forming a low refractive index modulation layer on a side of the high refractive index lens layer away from the base substrate; forming a first color filter layer in a subpixel region, and spaced apart from the high refractive index lens layer by the low refractive index modulation layer; and forming a first black matrix layer in an inter-subpixel region, and spaced apart from the high refractive index lens layer by the low refractive index modulation layer; wherein the high refractive index lens layer has a first refractive index; the low refractive index modulation layer has a second refractive index smaller than the first refractive index; the low refractive index modulation layer is substantially transparent and substantially free of a chromogenic material; and forming the high refractive index lens layer comprises forming a plurality of lens portions spaced apart from each other and respectively in the plurality of subpixels.

BRIEF DESCRIPTION OF THE FIGURES

The following drawings are merely examples for illustrative purposes according to various disclosed embodiments and are not intended to limit the scope of the present invention.

DETAILED DESCRIPTION

Figure 1:
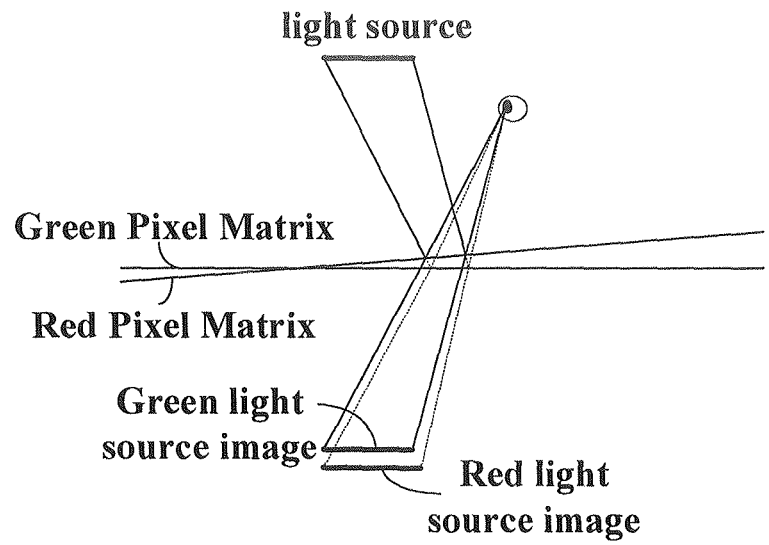
FIG. 1 is a schematic diagram showing a color breakup resulting from reflection of ambient light in a display panel in some embodiments according to the present disclosure.

The disclosure will now be described more specifically with reference to the following embodiments. It is to be noted that the following descriptions of some embodiments are presented herein for purpose of illustration and description only. It is not intended to be exhaustive or to be limited to the precise form disclosed.

Ambient light may be reflected by elements in an OLED display apparatus, resulting in a poor display quality of the OLED display apparatus, for example, resulting in color breakup.

Accordingly, the present disclosure provides, inter alia, a method of reducing color breakup of reflection of ambient light in a display panel, a display panel, a display apparatus, and a method of fabricating a display panel that substantially obviate one or more of the problems due to limitations and disadvantages of the related art. In one aspect, the present disclosure provides a method of reducing color breakup of reflection of ambient light in a display panel. In some embodiments, the display panel includes a base substrate; a plurality of light emitting elements on the base substrate and respectively in a plurality of subpixels; and a color breakup-prevention structure configured to reduce color breakup of reflection of ambient light in the plurality of subpixels. Optionally, the color breakup-prevention structure includes a high refractive index lens layer on a side of the plurality of light emitting elements away from the base substrate; a low refractive index modulation layer on a side of the high refractive index lens layer away from the base substrate; a first color filter layer in a plurality of subpixel regions, and spaced apart from the high refractive index lens layer by the low refractive index modulation layer; and a first black matrix layer in an inter-subpixel region, and spaced apart from the high refractive index lens layer by the low refractive index modulation layer. Optionally, the high refractive index lens layer has a first refractive index. Optionally, the low refractive index modulation layer has a second refractive index smaller than the first refractive index. Optionally, the low refractive index modulation layer is substantially transparent and substantially free of a chromogenic material. Optionally, the high refractive index lens layer includes a plurality of lens portions spaced apart from each other and respectively in the plurality of subpixels. In some embodiments, the method of reducing color breakup of reflection of ambient light includes refracting a first incident ambient light beam at a first interface between a respective one of the plurality of lens portions and a first medium on a side of the respective one of the plurality of lens portions away from the respective one of the plurality of light emitting elements, to generate a first refracted light beam having a direction altered from a direction of a light beam in the first medium; reflecting the first refracted light beam by a reflective structure in a respective one of the plurality of light emitting elements to generate a first reflected light beam to continue transmitting through at least the first medium, resulting in a first residual portion arriving at the first black matrix layer; and at least partially absorbing the first residual portion of the first reflected light beam by the first black matrix layer. Optionally, the method of reducing color breakup of reflection of ambient light further includes refracting a second incident ambient light beam at the first interface, to generate a second refracted light beam having a direction altered from the direction of the light beam in the first medium; reflecting the second refracted light beam by the reflective structure in the respective one of the plurality of light emitting elements to generate a second reflected light beam to continue transmitting through at least the first medium, resulting in a second residual portion arriving at the first color filter layer in a first adjacent subpixel adjacent to a subpixel having the respective one of the plurality of light emitting elements; and at least partially absorbing the second residual portion of the second reflected light beam by the first color filter layer in the first adjacent subpixel. Optionally, the first color filter layer in the first adjacent subpixel has a color different from a color of the first color filter layer in the subpixel having the respective one of the plurality of light emitting elements.

FIG. 1 is a schematic diagram showing a color breakup resulting from reflection of ambient light in a display panel in some embodiments according to the present disclosure. Referring to FIG. 1, a light source emits light beams in white color (e.g., ambient light) towards a display panel having a plurality of green subpixels and a plurality of red subpixels. The plurality of green subpixels forms a green pixel matrix having a reflecting surface which is not parallel to a reflective surface of a red pixel matrix formed by the plurality of red subpixels. The non-parallel pixel matrixes may be due to various processes including, but not limited to, a process of fabricating the display panel, and a process of bending the display panel. Ambient light beams reflected by elements in the display panel will transmit out of the display panel through different color filter blocks respectively corresponding to different subpixels, so that the ambient light beams reflected out of the display panel may display different colors based on different color filters through which the ambient light beams transmit. When a reflected ambient light beam transmits through one of the plurality of green subpixels, the reflected ambient light beam becomes a green reflected ambient light beam. When a reflected ambient light beam transmits through one of the plurality of red subpixels, the reflected ambient light beam becomes a red reflected ambient light beam. Since the reflecting surface of the green pixel matrix is not parallel to the reflect surface of the red pixel matrix, a plurality of green reflected ambient light beams transmit along a direction deviate from a direction along which a plurality of red reflected ambient light beams transmit, and human eyes will see a green light source image and a red light source image (e.g., color breakup), resulting in color breakup.

In one example, when the plurality of green reflected ambient light beams transmit along a direction deviating from a direction along which the plurality of red reflected ambient light beams transmit and deviating from a direction along which a plurality of blue reflected ambient light beams transmits, and human eyes will see a green light source image and a purple light source image (e.g. a combination of the red light source image and a blue light source image). In another example, when the plurality of blue reflected ambient light beams transmit along a direction deviating from a direction along which the plurality of red reflected ambient light beams transmit and deviating from a direction along which the plurality of green reflected ambient light beams transmits, and human eyes will see a blue light source image and a yellow light source image (e.g. a combination of the green light source image and a red light source image). In another example, when the plurality of red reflected ambient light beams transmit along a direction deviating from a direction along which the plurality of blue reflected ambient light beams transmit and deviating from a direction along which the plurality of green reflected ambient light beams transmits, and human eyes will see a red light source image and a cyan light source image (e.g. a combination of the green light source image and a blue light source image)

Figure 2:
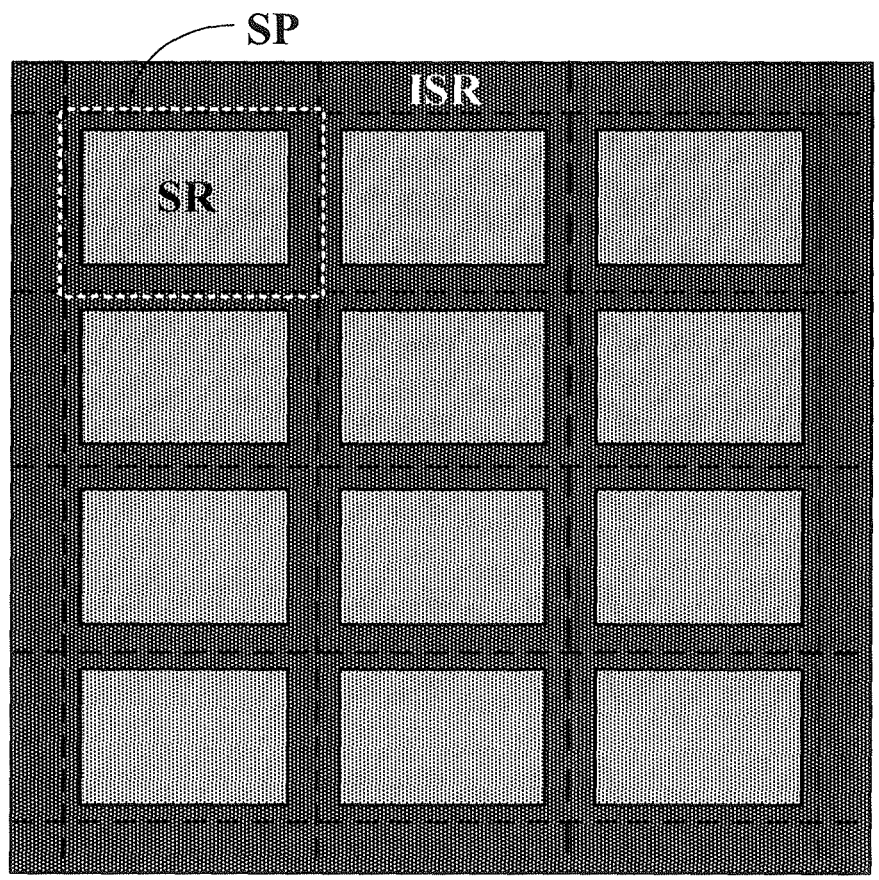
FIG. 2 is a plan view of a display panel in some embodiments according to the present disclosure.

FIG. 2 is a plan view of a display panel in some embodiments according to the present disclosure. In some embodiments, referring to FIG. 2, the display panel includes a plurality of subpixel regions SR and an inter-subpixel region ISR.

As used herein, a respective one of the plurality of subpixel regions refers to a light emission region of a subpixel, such as a region corresponding to a pixel electrode in a liquid crystal display, a region corresponding to a light emissive layer in an organic light emitting diode display panel, or a region corresponding to the light transmission layer in the present disclosure. Optionally, a pixel may include a number of separate light emission regions corresponding to a number of subpixels in the pixel. Optionally, the subpixel region is a light emission region of a red color subpixel. Optionally, the subpixel region is a light emission region of a green color subpixel. Optionally, the subpixel region is a light emission region of a blue color subpixel. Optionally, the subpixel region is a light emission region of a white color subpixel.

As used herein, an inter-subpixel region refers to a region between adjacent subpixel regions, such as a region corresponding to a black matrix in a liquid crystal display, a region corresponding a pixel definition layer in an organic light emitting diode display panel, or a black matrix in the present display panel. Optionally, the inter-subpixel region is a region between adjacent subpixel regions in a same pixel. Optionally, the inter-subpixel region is a region between two adjacent subpixel regions from two adjacent pixels. Optionally, the inter-subpixel region is a region between a subpixel region of a red color subpixel and a subpixel region of an adjacent green color subpixel. Optionally, the inter-subpixel region is a region between a subpixel region of a red color subpixel and a subpixel region of an adjacent blue color subpixel. Optionally, the inter-subpixel region is a region between a subpixel region of a green color subpixel and a subpixel region of an adjacent blue color subpixel.

In some embodiments, the display panel includes a plurality of subpixels SP. Optionally, a respective one of the plurality of subpixels SP includes a respective one of the plurality of subpixel regions SR and a portion of inter-subpixel regions ISR surrounding the respective one of the plurality of subpixel regions SR.

Figure 3A:
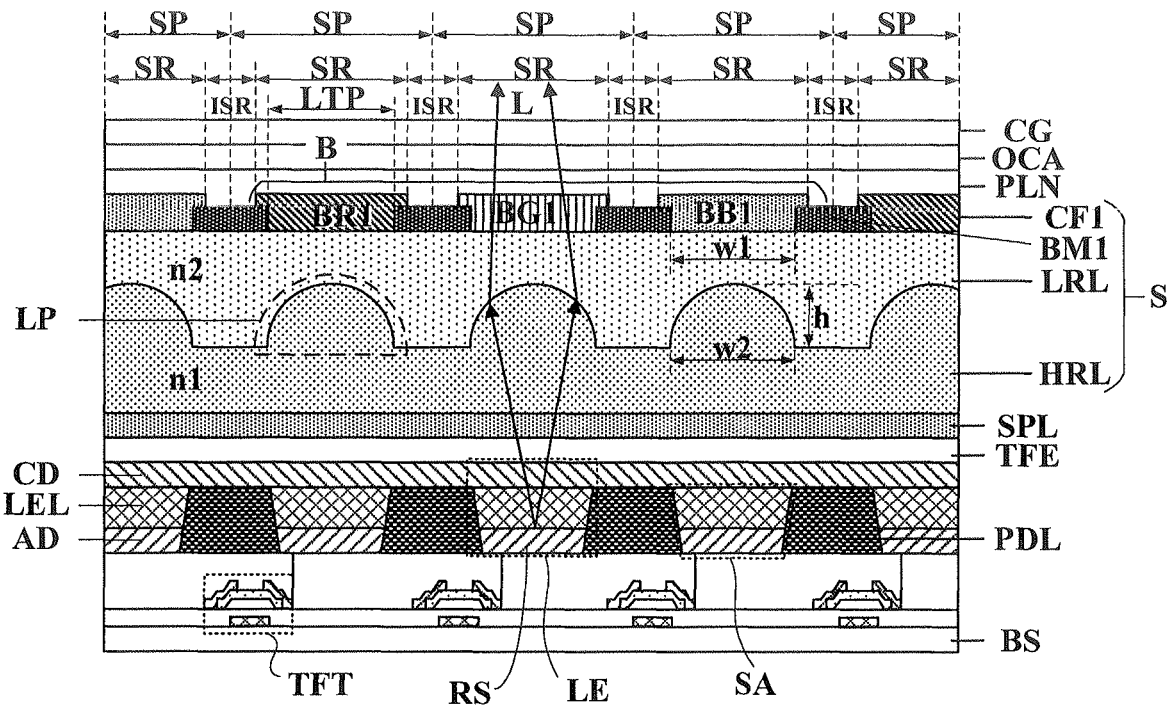
FIG. 3A is a schematic diagram of a structure of a display panel in some embodiments according to the present disclosure.

FIG. 3A is a schematic diagram of a structure of a display panel in some embodiments according to the present disclosure. In some embodiment, referring to FIG. 2 and FIG. 3A, the display panel includes a base substrate BS; a plurality of light emitting elements LE on the base substrate BS and respectively in a plurality of subpixels SP; and a color breakup-prevention structure S configured to reduce color breakup of reflection of ambient light in the plurality of subpixels SP. Optionally, a respective one of the plurality of light emitting elements LE includes an anode AD, a cathode CD opposite to the anode AD, and a light emitting layer LEL between the anode AD and the cathode CD.

In some embodiments, the color breakup-prevention structure S includes a high refractive index lens layer HRL on a side of the plurality of light emitting elements LE away from the base substrate BS; a low refractive index modulation layer LRL on a side of the high refractive index lens layer HRL away from the base substrate BS; a first color filter layer CF1 in a plurality of subpixel regions SR, and spaced apart from the high refractive index lens layer HRL by the low refractive index modulation layer LRL; and a first black matrix layer BM1 in an inter-subpixel region ISR, and spaced apart from the high refractive index lens layer HRL, by the low refractive index modulation layer LRL. Optionally, the first color filter layer CF1 includes a plurality of color filter blocks B respectively in the plurality of subpixels SP. For example, the plurality of color filter blocks B includes a plurality of color filter blocks in red color BR1, a plurality of color filter blocks in green color BG1, and a plurality of color filter blocks in blue color BB1.

Optionally, the high refractive index lens layer HRL has a first refractive index n1. Optionally, the low refractive index modulation layer LRL has a second refractive index n2 smaller than the first refractive index n1.

Optionally, the low refractive index modulation layer LRL is substantially transparent and substantially free of a chromogenic material, for example, an entirety of the low refractive index modulation layer LRL does not include a color filter material. Optionally, the high refractive index lens layer HRL includes a plurality of lens portions LP spaced apart from each other and respectively in the plurality of subpixels SP.

As used herein, the term "substantially transparent" means at least 50 percent (e.g., at least 60 percent, at least 70 percent, at least 80 percent, at least 90 percent, and at least 95 percent) of an incident light in the visible wavelength range transmitted therethrough.

As used herein, the term "substantially free" of a chromogenic material means that a ratio of a weigh of a chromogenic material in a target layer to a weight of the target layer is less than 5% (e.g., less than 5%, less than 4%, less than 3%, less than 2%, less than 1%, and 0%) or a ratio of a volume of the chromogenic material to a volume of the target layer is less than 5% (e.g., less than 5%, less than 4%, less than 3%, less than 2%, less than 1%, and 0%).

Various materials may be used as the chromogenic material. Examples of materials suitable to be used as the chromogenic material include, but are not limited to materials reacting with agents to develop different colors. Optionally, examples of materials suitable to be used as the chromogenic material include, but are not limited to fluoran-family, indolyl-phthalide family, rhodamine-lactam family materials, triphenylmethane-phthalide family, spiro-pyran family, triphenylmethane family materials. Optionally, the chromogenic materials may include a quantum dots material.

In some embodiments, the plurality of lens portions LP are respectively in the plurality of subpixels SP. Optionally, the plurality of lens portions LP are respectively in the plurality of subpixel regions SR. Optionally, the plurality of lens portions LP are spaced apart from each other by the inter-subpixel region ISR, e.g., the plurality of lens portions LP are absent in the inter-subpixel region ISR. Optionally, the plurality of lens portions LP and the plurality of color filter blocks have a one-to-one correspondence relationship.

In some embodiments, a light beam L is emitted from the respective one of the plurality of light emitting elements LE and transmits along a direction away from the base substrate BS and toward the color filter layer (e.g., the first color filter layer CF1). Optionally, the light beam L is converged by at least the respective one of the plurality of lens portions LP to enhance light extraction of the display panel.

Figure 3B:
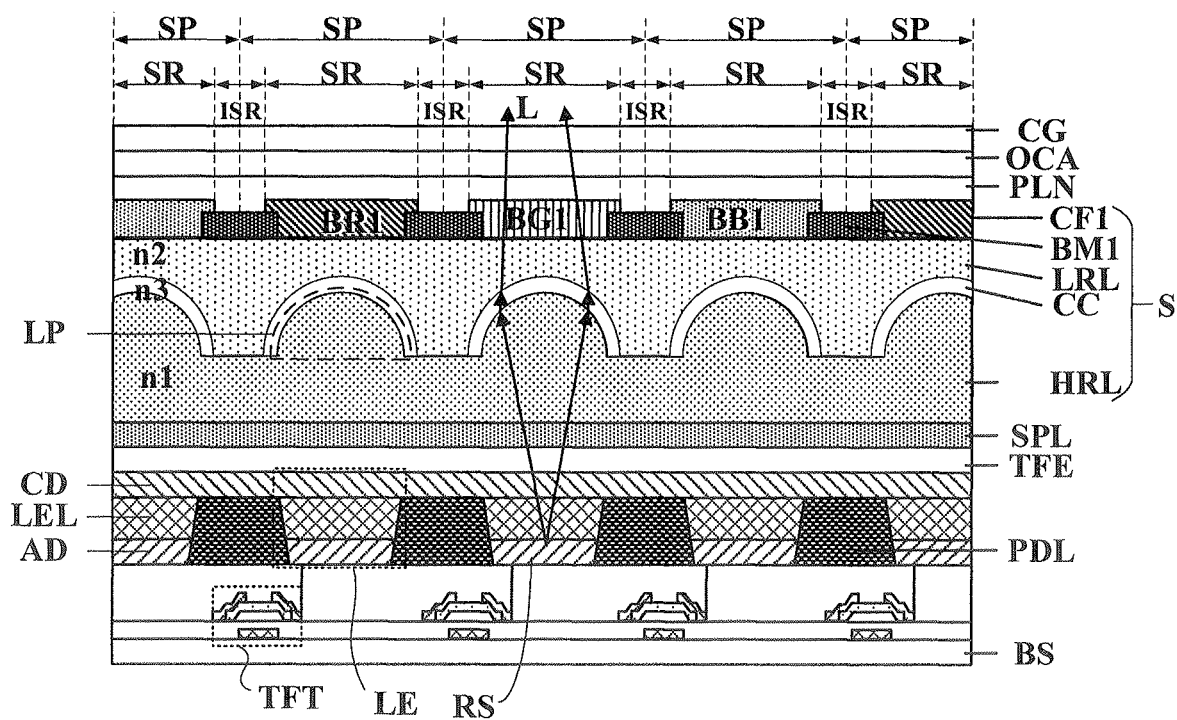
FIG. 3B is a schematic diagram of a structure of a display panel in some embodiments according to the present disclosure.

FIG. 3B is a schematic diagram of a structure of a display panel in some embodiments according to the present disclosure, in some embodiments, referring to FIG. 3B, the display panel further includes a plurality of cavity chambers CC. Optionally, the plurality of cavity chambers CC are spaced apart from each other, and respectively cover the plurality of lens portions LP. Optionally, the respective one of the plurality of cavity chambers CC spaces apart the respective one of the plurality of lens portions LP from the low refractive index modulation layer LRL. Optionally, referring to FIG. 3B, the respective one of the plurality of cavity chambers CC covers an outer surface of a respective one of the plurality of lens portions LP. Optionally, referring to FIG. 3B, the respective one of the plurality of cavity chambers CC covers an arched surface of the respective one of the plurality of lens portions LP.

In some embodiments, the plurality of lens portions LP are respectively in the plurality of subpixels SP. Optionally, the plurality of lens portions LP are respectively in the plurality of subpixel, regions SR. Optionally, the plurality of lens portions LP are spaced apart from each other by the inter-subpixel region ISR. In some embodiments, the plurality of cavity chambers CC are respectively in the plurality of subpixels SP. Optionally, the plurality of cavity chambers CC are respectively in the plurality of subpixel regions SR. Optionally, the plurality of cavity chambers CC are spaced apart from each other by the inter-subpixel region ISR, e.g., the plurality of cavity chambers CC are absent in the inter-subpixel region ISR. Optionally, the plurality of cavity chambers CC and the plurality of color filter blocks have a one-to-one correspondence relationship.

Optionally, the respective one of the plurality of cavity chambers CC has a third refractive index $n3$ smaller than the second refractive index $n2$. Optionally, the refractive index $n3$ is smaller than the first refractive index $n1$. Optionally, the respective one of the plurality of cavity chambers CC is made of a material having a refractive index $n3$ that is smaller than $n1$ and smaller than $n2$. Optionally, the respective one of the plurality of cavity chambers CC is made of air. Optionally, the respective one of the plurality of cavity chambers CC is a substantially empty chamber, e.g., a vacuumed chamber. Optionally, the respective one of the plurality of cavity chambers CC is made of a liquid material. Optionally, the respective one of the plurality of cavity chambers CC is made of a gaseous material. Optionally, the respective one of the plurality of cavity chambers CC is made of a substantially transparent material.

In some embodiments, a light beam L is emitted from the respective one of the plurality of light emitting elements LE and transmits along a direction away from the base substrate BS and toward the color filter layer (e.g., the first color filter layer CF1). Optionally, the light beam L is converged by at least the respective one of the plurality of lens portions LP to enhance light extraction of the display panel. For example, the light beam is sequentially converged by the respective one of the plurality of lens portions LP and the respective one of the plurality of cavity chambers.

Since the respective one of the plurality of cavity chambers are added in the light path of the light beam and $n3$ is smaller than $n2$, a difference between $n3$ and $n1$ is greater than a difference between $n2$ and $n1$, the light extraction efficiency of the display panel is increased, and the likelihood that an ambient light is reflected out of the display panel is reduced.

Figure 3C:
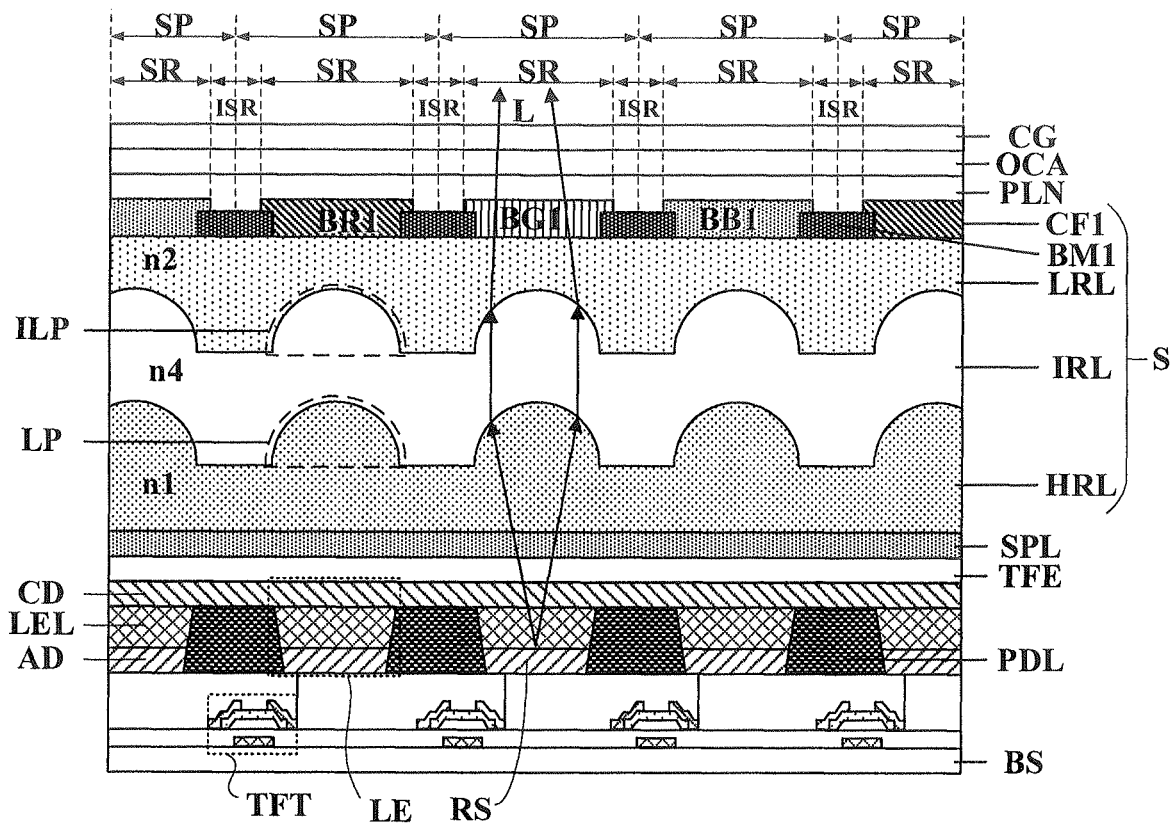
FIG. 3C is a schematic diagram of a structure of a display panel in some embodiments according to the present disclosure.

FIG. 3C is a schematic diagram of a structure of a display panel in some embodiments according to the present disclosure. In some embodiments, referring to FIG. 3C, the color breakup-prevention structure further includes an intermediate refractive index lens layer IRL between the high refractive index lens layer HRL and the low refractive index modulation layer LRL. Optionally, the intermediate refractive index lens layer IRL includes a plurality of intermediate lens portions ILP spaced apart from each other and respectively in the plurality of subpixels SP. Optionally, the intermediate refractive index lens layer IRL has a fourth refractive index $n4$ between the first refractive index $n1$ and the second refractive index $n2$, for example, $n2<n4<n1$.

In some embodiments, the plurality of lens portions LP are respectively in the plurality of subpixels SP. Optionally, the plurality of lens portions LP are respectively in the plurality of subpixel regions SR. Optionally, the plurality of lens portions LP are spaced apart from each other by the inter-subpixel region ISR. In some embodiments, the plurality of intermediate lens portions ILP are respectively in the plurality of subpixels SP. Optionally, the plurality of intermediate lens portions ILP are respectively in the plurality of subpixel regions SR. Optionally, the plurality of intermediate lens portions ILP are spaced apart from each other by the inter-subpixel region ISR, e.g., the plurality of intermediate lens portions ILP are absent in the inter-subpixel region ISR. Optionally, the plurality of intermediate lens portions ILP and the plurality of color filter blocks have a one-to-one correspondence relationship. In some embodiments, the plurality of lens portions LP and the plurality of intermediate lens portions ILP have a one-to-one correspondence relationship.

In some embodiments, a light beam L is emitted from the respective one of the plurality of light emitting elements LE and transmits along a direction away from the base substrate BS and toward the color filter layer (e.g., the first color filter layer CF1). Optionally, the light beam L is converged by at least the respective one of the plurality of lens portions LP to enhance light extraction of the display panel. For example, the light beam is sequentially converged by the respective one of the plurality of lens portions LP and the respective one of the plurality of intermediate lens portions ILP.

Figure 4A:
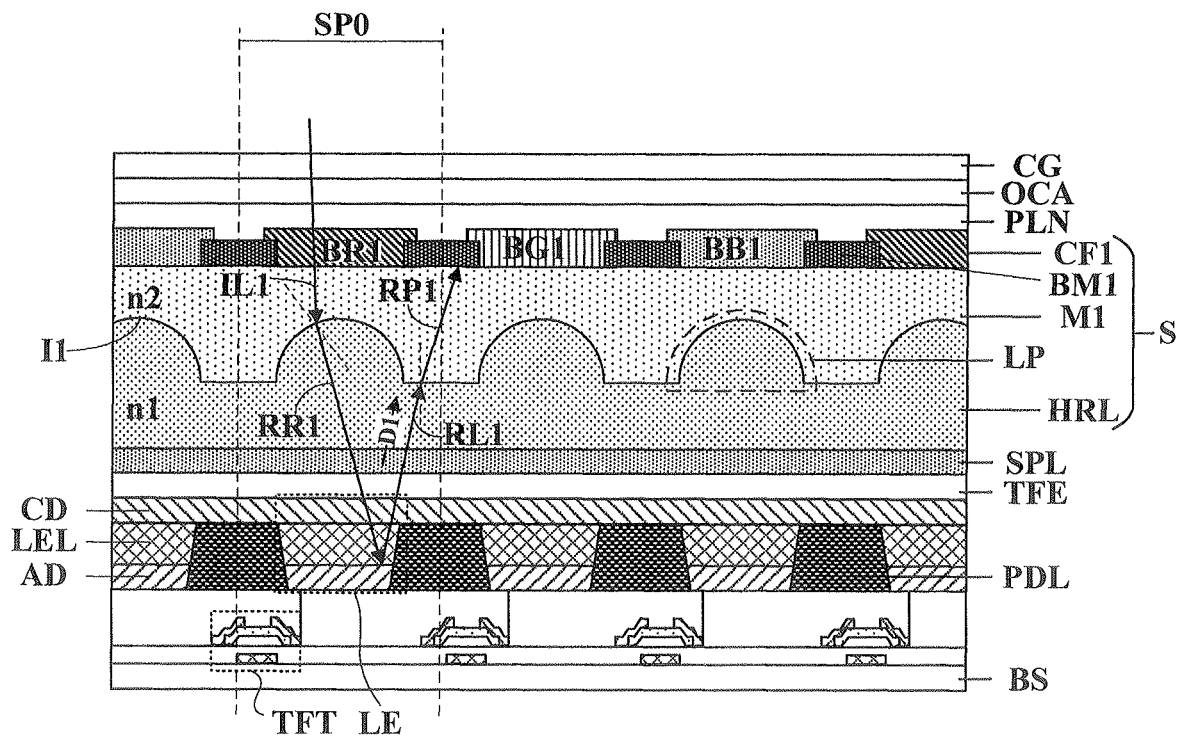
FIG. 4A is a schematic diagram illustrating reflection of ambient light in a display panel in some embodiments according to the present disclosure.

FIG. 4A is a schematic diagram illustrating reflection of ambient light in a display panel in some embodiments according to the present disclosure. In some embodiments, referring to FIG. 3A and FIG. 4A, the method of reducing color breakup of reflection of ambient light includes refracting a first incident ambient light beam IL1 at a first interface I1 between a respective one of the plurality of lens portions LP and a first medium M1 on a side of the respective one of the plurality of lens portions LP away from the respective one of the plurality of light emitting elements LE, to generate a first refracted light beam RR1 having a direction altered from a direction of a light beam (e.g., the first incident ambient light beam IL1) in the first medium M1. Optionally, the first medium M1 is the low refractive index modulation layer LRL. Optionally, the first medium M1 has a shape complementary to a shape of the high refractive index lens layer HRL. Optionally, the first medium M1 is in direct contact with the high refractive index lens layer HRL.

Optionally, the method of reducing color breakup of reflection of ambient light further includes reflecting the first refracted light beam RR1 by a reflective structure RS in a respective one of the plurality of light emitting elements LE to generate a first reflected light beam RL1 to continue transmitting through at least the first medium M1, resulting in a first residual portion RP1 arriving at the first black matrix layer BM1. Optionally, the first reflected light beam RL1 transmits along a first direction D1 toward the first black matrix layer BM1. Optionally, the reflective structure RS is the anode AD of the respective one of the plurality of light emitting elements LE.

Optionally, the method of reducing color breakup of reflection of ambient light further includes at least partially absorbing the first residual portion RP1 of the first reflected light beam RL1 by the first black matrix layer BM1.

Because the first residual portion RP1 of the first reflected light beam RL1 is absorbed by the first black matrix layer BM1, a portion of ambient light reflected by elements in the display panel (e.g., the plurality of light emitting elements LE) will not be transmitted out of the display panel, which may reduce the color breakup and other problems due to the reflection of ambient light.

Figure 4B:
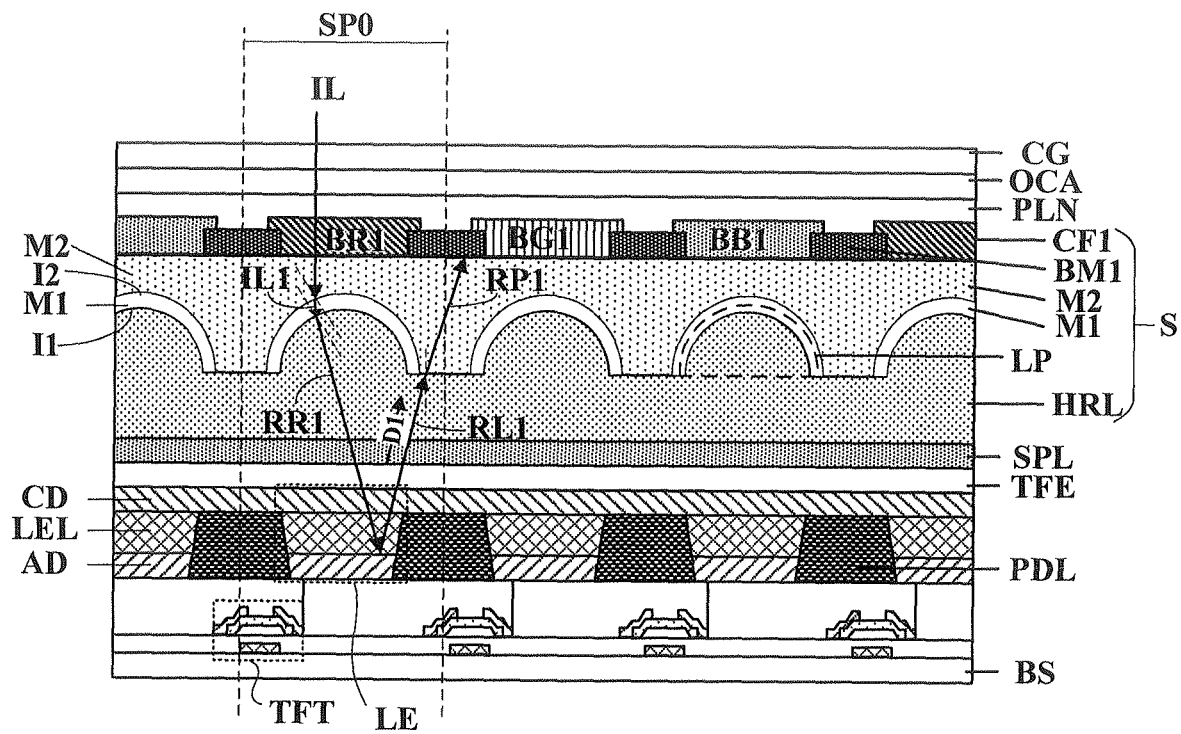
FIG. 4B is a schematic diagram illustrating reflection of ambient light in a display panel in some embodiments according to the present disclosure.

FIG. 4B is a schematic diagram illustrating reflection of ambient light in a display panel in some embodiments according to the present disclosure. In some embodiments, referring to FIG. 3B and FIG. 4B, prior to refracting the first incident ambient light beam IL1 at the first interface I1, the method of reducing color breakup of reflection of ambient light further includes refracting the incident ambient light beam IL at a second interface I2 to generate the first incident ambient light beam IL1.

Optionally, the first interface I1 is between the respective one of the plurality of lens portions LP and the first medium M1 on a side of the respective one of the plurality of lens portions LP away from the respective one of the plurality of light emitting elements LE. Optionally, the first medium M1 is a material of the plurality of cavity chambers CC. Optionally, the second interface I2 is between the respective one of the plurality of cavity chambers CC first medium M1) and the second medium M2 on a side of the respective one of the plurality of cavity chambers CC away from the respective one of the plurality of lens portions LP. Optionally, the second medium M2 is a material of the low refractive index modulation layer LRL.

In one example, subsequent to generation of the first incident ambient light beam IL1, the first incident ambient light beam IL1 enters the respective one of the plurality of lens portions LP. The light path thereafter is largely similar to or substantially the same as that described in connection with FIG. 4A after the first incident ambient light beam IL1 enters the respective one of the plurality of lens portions LP.

In another example, the method of reducing color breakup of reflection of ambient light further includes refracting the first incident ambient light beam IL1 at the first interface I1 to generate the first refracted light beam RR1; and reflecting the first refracted light beam by the reflective structure RS in the respective one of the plurality of light emitting elements to generate the first reflected light beam RL1. The first reflected light beam RL1 in some embodiments continues transmitting through at least the first medium M1 (e.g., the material of the plurality of cavity chambers CC). For example, the first reflected light beam RL1, subsequent to transmitting through the first interface IL at least a portion of the first reflected light beam RL1 continue transmitting through the first medium M1 and then the second medium M2 (e.g., the material of the low refractive index modulation layer LRL), resulting in the first residual portion RP1 arriving at the first black matrix layer BM1. More specifically, the at least a portion of the first reflected light beam RL1 is refracted at the first interface I1, a resulting refracted light beam transmits through the first medium M1 and is refracted again at the second interface I2, resulting in the first residual portion RP1.

Figure 4C:
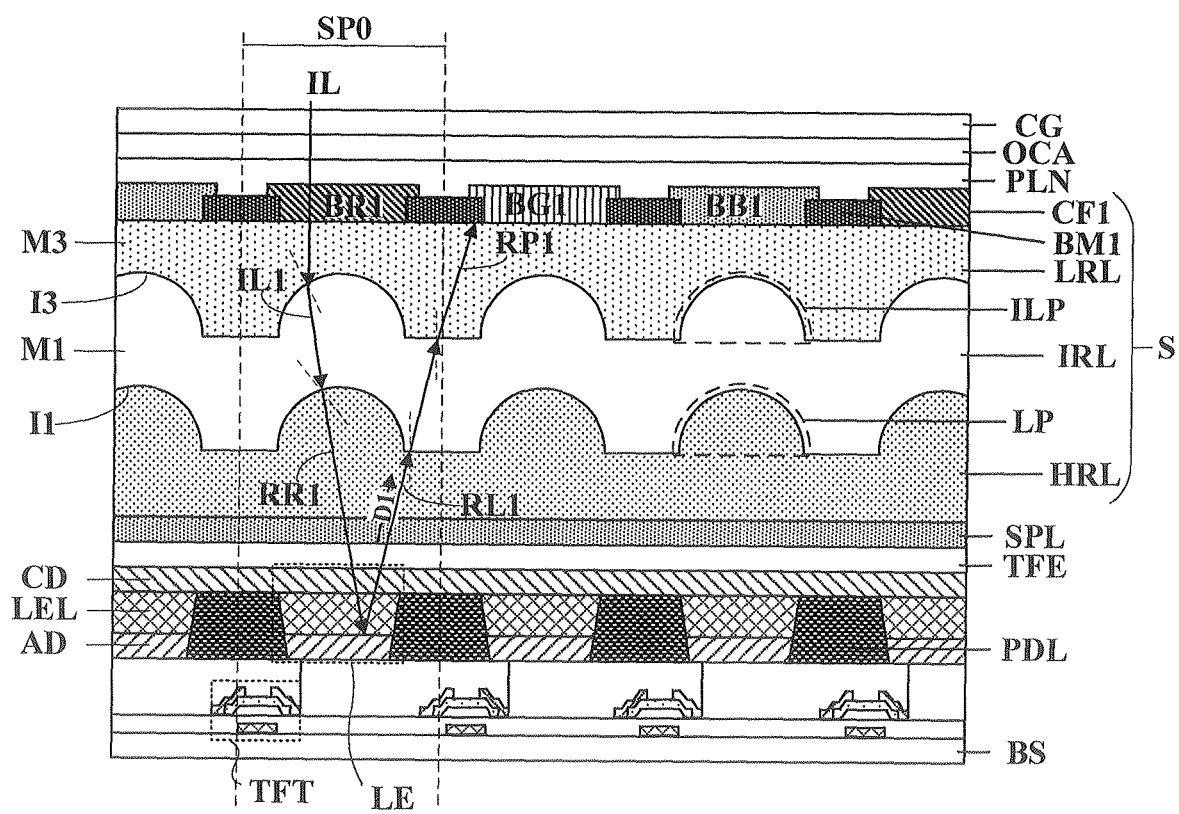
FIG. 4C is a schematic diagram illustrating reflection of ambient light in a display panel in some embodiments according to the present disclosure.

FIG. 4C is a schematic diagram illustrating reflection of ambient light in a display panel in some embodiments according to the present disclosure. In some embodiments, referring to FIG. 3C and FIG. 4C, prior to refracting the first incident ambient light beam IL1 at the first interface IL the method of reducing color breakup of reflection of ambient light further includes refracting an incident ambient light beam IL at a third interface I3 to generate the first incident ambient light beam IL1.

Optionally, the first interface I1 is between the plurality of lens portions LP and the first medium M1 on a side of the respective one of the plurality of lens portions LP away from the respective one of the plurality of light emitting elements LE. Optionally, the first medium M1 is the intermediate refractive index lens layer IRL having the plurality of intermediate lens portion ILP. Optionally, the third interface I3 is between a respective one of a plurality of intermediate lens portions ILP and a third medium M3 on a side of the intermediate refractive index lens layer IRL away from the respective one of the plurality of lens portions LP. Optionally, the third medium M3 is the low refractive index modulation layer LRL.

Optionally, the method of reducing color breakup of reflection of ambient light further includes refracting the first incident ambient light beam IL1 at the first interface I1 to generate the first refracted light beam RR1; and reflecting the first refracted light beam RR1 by the reflective structure RS to generate the first reflected light beam RL1 to continue transmitting through at least the first medium M1, resulting in the first residual portion RP1 arriving at the first black matrix layer BM1. For example, the first reflected light beam RL1, subsequent to transmitting through the first interface I1, at least a portion of the first reflected light beam RL1 continue to transmitting through the first medium M1 (e.g., the intermediate refractive index lens layer IRL) and the third medium M3 (e.g., the low refractive index modulation layer LRL), resulting in the first residual portion RP1 arriving at the first black matrix layer BM1. More specifically, the at least a portion of the first reflected light beam RL1 is refracted at the first interface I1, a resulting refracted light beam transmits through the first medium M1 (e.g., the intermediate refractive index lens layer IRL) and is refracted again at the third interface I3, resulting in the first residual portion RP1.

Figure 5A:
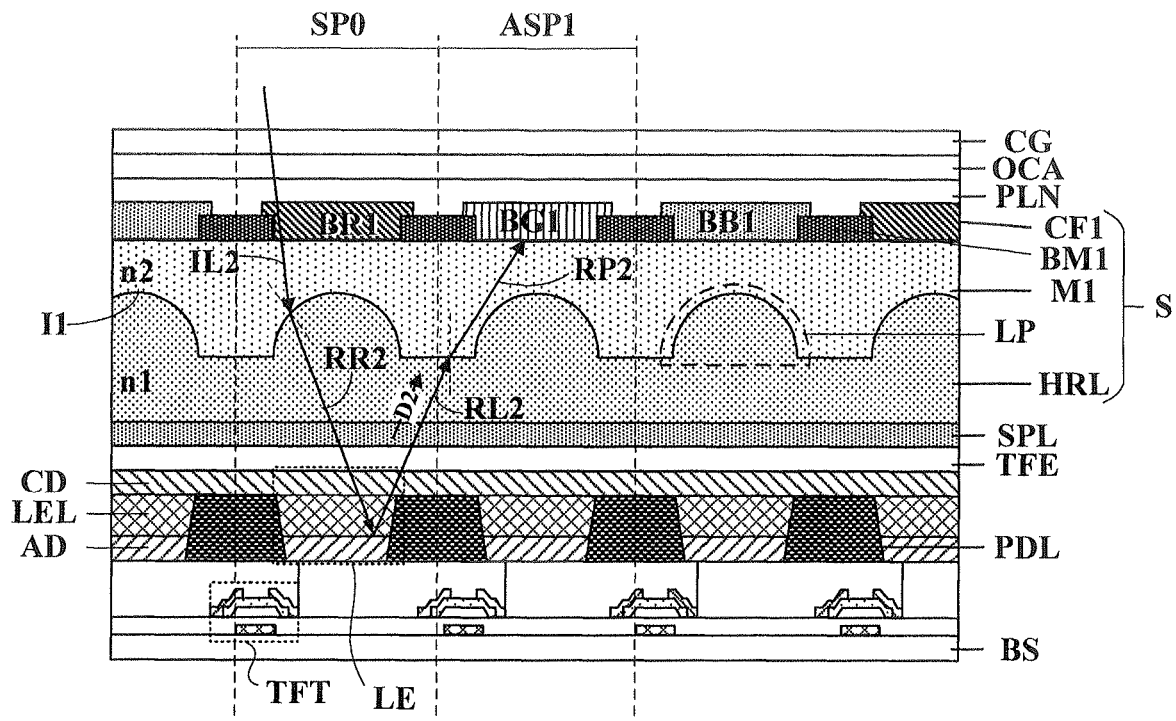
FIG. 5A is a schematic diagram illustrating reflection of ambient light in a display panel in some embodiments according to the present disclosure.

FIG. 5A is a schematic diagram illustrating reflection of ambient light in a display panel in some embodiments according to the present disclosure. In some embodiments, referring to FIG. 3A and FIG. 5A, the method of reducing color breakup of reflection of ambient light further includes refracting a second incident ambient light beam IL2 at the first interface I1, to generate a second refracted light beam RR2 having a direction altered from the direction of the light beam (e.g., second incident ambient light beam IL2) in the first medium M1. Optionally, the first medium M1 is the low refractive index modulation layer LRL.

Optionally, the method of reducing color breakup of reflection of ambient light further includes reflecting the second refracted light beam RR2 by the reflective structure RS in the respective one of the plurality of light emitting elements LE to generate a second reflected light beam RL2 to continue transmitting through at least the first medium M1, resulting in a second residual portion RP2 arriving at the first color filter layer CF1 in a first adjacent subpixel ASP1 adjacent to a subpixel SP0 having the respective one of the plurality of light emitting elements LE. For example, the subpixel SP0 having the respective one of the plurality of light emitting elements LE corresponds to a respective one of the plurality of color filter blocks from which an ambient light transmits inside the display panel, and the second incident ambient light beam IL2 is originated from the ambient light.

For example, the second reflected light beam RR2 transmits along a second direction D2 toward the first color filter layer CF1 in the first adjacent subpixel ASP1 adjacent to a subpixel SP0 having the respective one of the plurality of light emitting elements LE.

As used herein, the term "adjacent" refers to abutting, immediately next to, juxtaposed, touching, in close proximity to, or near (without actually touching). For example, two adjacent items may abut one another or be separated by an intermediate item. In one example, two adjacent subpixels may be two immediately adjacent subpixels. In another example, two adjacent subpixel may be two subpixels spaced apart by at least another subpixel.

Optionally, the first adjacent subpixel ASP1 is immediately adjacent to the subpixel SP0 having the respective one of the plurality of light emitting elements LE. Optionally, at least one subpixel is between the first adjacent subpixel ASP1 and the subpixel SP0 having the respective one of the plurality of light emitting elements LE.

Optionally, the method of reducing color breakup of reflection of ambient light further includes at least partially absorbing the second residual portion RP2 of the second reflected light beam RL2 by the first color filter layer CF1 in the first adjacent subpixel ASP1.

Optionally, the first color filter layer CF1 in the first adjacent subpixel ASP1 has a color different from a color of the first color filter layer CF1 in the subpixel SP0 having the respective one of the plurality of light emitting elements LE, e.g., one of the plurality of color filter blocks corresponding to the first adjacent subpixel ASP1 has a color different from a color of the respective one of the plurality of color filter blocks corresponding to the respective one of the plurality of light emitting elements LE.

For example, the one of the plurality of color filter blocks corresponding to the first adjacent subpixel ASP1 has a green color (e.g., one of the plurality of color filter blocks in green color BG1), the respective one of the plurality of color filter blocks corresponding to the respective one of the plurality of light emitting elements LE has a red color (e.g., one of the plurality of color filter blocks in red color BR1). After an incident ambient light beam transmits through the respective one of the plurality of color filter blocks (e.g., one of the plurality of color filter blocks in red color BR1) corresponding to the respective one of the plurality of light emitting elements LE to generate the second incident ambient light beam the second incident ambient light beam IL2 has a color the same as the color (e.g., red) of the respective one of the plurality of color filter blocks. The second refracted light beam RR2 and the second reflected light beam RL2 also have a same color (e.g., red) as the second incident light beam IL2. When the second residual portion RP2 of the second reflected light beam RL2 hits one of the plurality of color filter blocks (e.g., one of the plurality of color filter blocks in green color BG1) corresponding to the first adjacent subpixel ASP1, the color (e.g., red) of the second residual portion RP2 of the second reflected light beam RL2 is different from the color (e.g., green) of the one of the plurality of color filter blocks (e.g., one of the plurality of color filter blocks in green color BG1) corresponding to the first adjacent subpixel ASP1, so, the second residual portion RP2 of the second reflected light beam RL2 is absorbed by the one of the plurality of color filter blocks corresponding to the first adjacent subpixel ASP1, which prevents the second residual portion RP2 of the second reflected light beam RL2 from transmitting out of the display panel, thereby reducing the color breakup and other problems due to the reflection of ambient light.

Figure 5B:
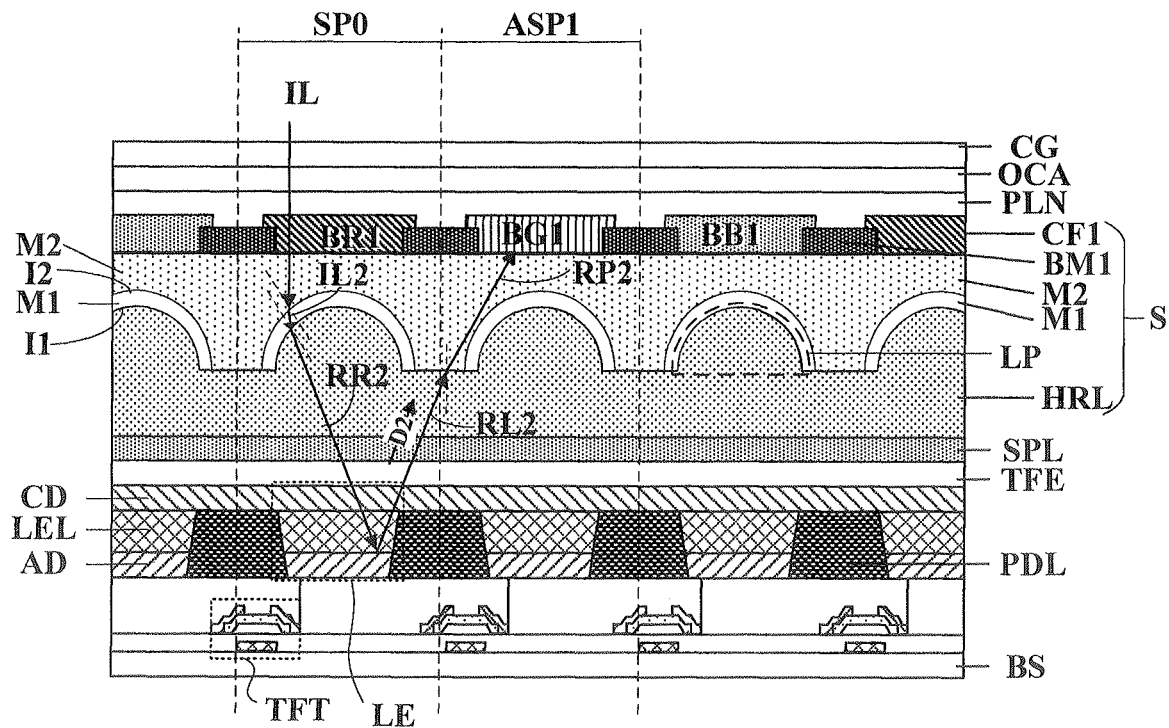
FIG. 5B is a schematic diagram illustrating reflection of ambient light in a display panel in some embodiments according to the present disclosure.

FIG. 5B is a schematic diagram illustrating reflection of ambient light in a display panel in some embodiments according to the present disclosure. In some embodiments, referring to FIG. 3B and FIG. 5B, prior to refracting the second incident ambient light beam IL2 at the first interface I1, the method of reducing color breakup of reflection of ambient light further includes refracting the incident ambient light beam IL at the second interface I2 to generate the second incident ambient light beam IL2.

Optionally, the first interface I1 is between the respective one of the plurality of lens portions LP and the first medium M1 on a side of the respective one of the plurality of lens portions LP away from the respective one of the plurality of light emitting elements LE. Optionally, the first medium M1 is a material of the plurality of cavity chambers CC. Optionally, the second interface I2 is between the respective one of the plurality of cavity chambers CC (e.g., first medium M1) and the second medium M2 on a side of the respective one of the plurality of cavity chambers CC away from the respective one of the plurality of lens portions LP. Optionally, the second medium M2 is a material of the low refractive index modulation layer LRL.

In one example, subsequent to generation of the second incident ambient light beam IL2, the second incident ambient light beam IL2 enters the respective one of the plurality of lens portions LP. The light path thereafter is largely similar to or substantially the same as that described in connection with FIG. 5A after the second incident ambient light beam IL1 enters the respective one of the plurality of lens portions LP.

In another example, the method of reducing color breakup of reflection of ambient light further includes refracting the second incident ambient light beam IL2 at the first interface I1, and reflecting the second refracted light beam IL2 by the reflective structure RS in the respective one of the plurality of light emitting elements LE to generate the second reflected light beam RL2. The second reflected light beam RL2 in some embodiments continue transmitting through at least the first medium M1 (e.g., the material of the plurality of cavity chambers CC), resulting in the second residual portion RP2 arriving at the first color filter layer CF1 in the first adjacent subpixel ASP1 adjacent to the subpixel SP0 having the respective one of the plurality of light emitting elements LE. For example, the second reflected light beam RL2, subsequent to transmitting through the first interface I1, at least a portion of the second reflected light beam RL2 continue to transmit through the first medium M1 and then the second medium M2 (e.g., the material of the low refractive index modulation layer LRL), resulting in the second residual portion RP2 arriving at first color filter layer CF1 in the first adjacent subpixel ASP1. More specifically, the at least a portion of the second reflected light beam RL2 is refracted at the first interface I1, a resulting refracted light beam transmits through the first medium M1 and is refracted again at the second interface I2 between the first medium M1 and the second medium M2, resulting in the second residual portion RP2.

Figure 5C:
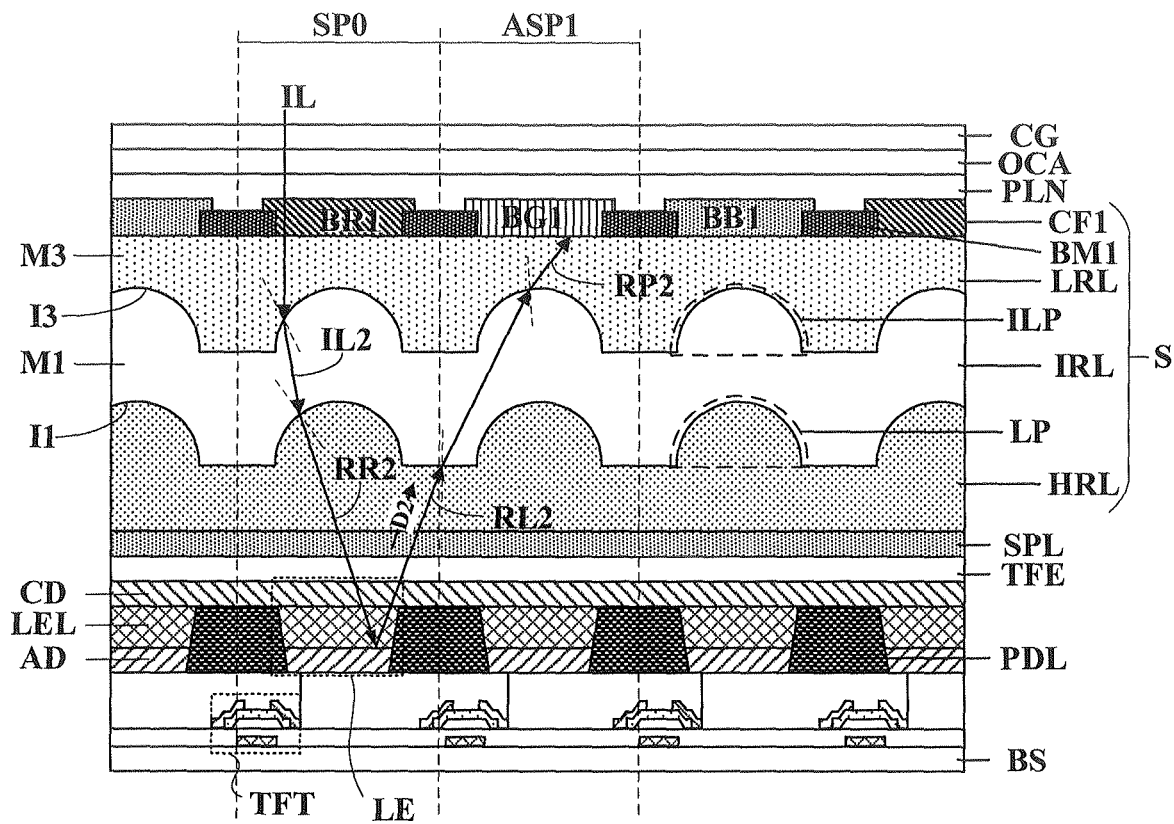
FIG. 5C is a schematic diagram illustrating reflection of ambient light in a display panel in some embodiments according to the present disclosure.

FIG. 5C is a schematic diagram illustrating reflection of ambient light in a display panel in some embodiments according to the present disclosure. In some embodiments, referring to FIG. 3C and FIG. 5C, prior to refracting the second incident ambient light beam IL2 at the first interface I1, the method of reducing color breakup of reflection of ambient light further includes refracting the incident ambient light beam IL at the third interface I3 to generate the second incident ambient light beam IL2.

Optionally, the first interface I1 is between the plurality of lens portions LP and the first medium M1 on a side of the respective one of the plurality of lens portions LP away from the respective one of the plurality of light emitting elements LE. Optionally, the first medium M1 is a material of the intermediate refractive index lens layer IRL having the plurality of intermediate lens portion ILP. Optionally, the third interface I3 is between a respective one of a plurality of intermediate lens portions ILP and a third medium M3 on a side of the intermediate refractive index lens layer IRL away from the respective one of the plurality of lens portions LIP. Optionally, the third medium M3 is a material of the low refractive index modulation layer LRL.

Optionally, the method of reducing color breakup of reflection of ambient light further includes refracting the second incident ambient light beam IL2 at the first interface I1 to generate the second refracted light beam RR2; and reflecting the second refracted light beam RR2 by the reflective structure RS to generate the second reflected light beam RL2 to continue transmitting through at least the first medium M1, resulting in a second residual portion RP2 arriving at the first color filter layer CF1 in the first adjacent subpixel ASP1 adjacent to the subpixel SP0 having the respective one of the plurality of light emitting elements LE.

For example, the second reflected light beam RL2, subsequent to transmitting through the first interface I1, at least a portion of the second reflected light beam RL2 continue to transmitting through the first medium M1 (e.g., a material of the intermediate refractive index lens layer IRL) and the third medium M3 (e.g., a material of the low refractive index modulation layer LRL), resulting in the second residual portion RP2 arriving at the first color filter layer CF1 in the first adjacent subpixel ASP1. More specifically, the at least a portion of the second reflected light beam RL2 is refracted at the first interface I1, a resulting refracted light beam transmits through the first medium M1 (e.g., the intermediate refractive index lens layer IRL) and is refracted again at the third interface I3, resulting in the second residual portion RP2.

Figure 6A:
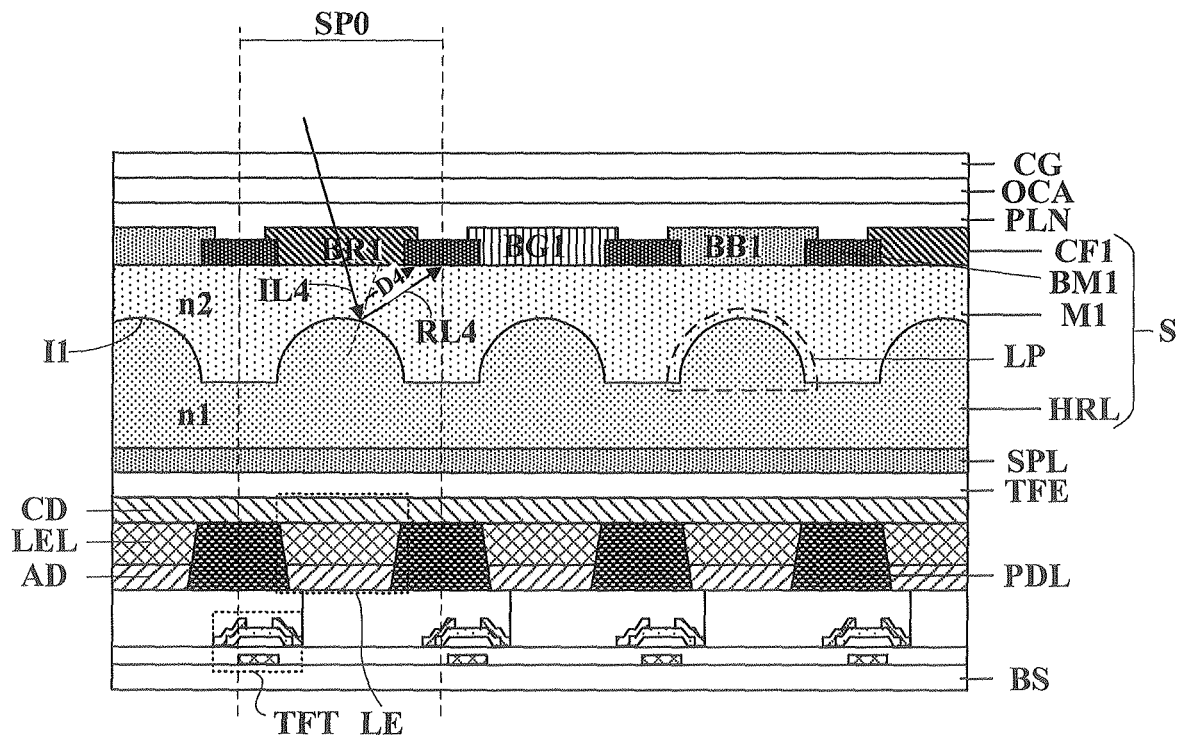
FIG. 6A is a schematic diagram illustrating reflection of ambient light in a display panel in some embodiments according to the present disclosure.

FIG. 6A is a schematic diagram illustrating reflection of ambient light in a display panel in some embodiments according to the present disclosure. In some embodiments, referring to FIG. 3A and FIG. 6A, the method of reducing color breakup of reflection of ambient light further includes reflecting a fourth incident ambient light beam IL4 at the first interface I1 to generate a fourth reflected light beam RL4. Optionally, the fourth reflected light beam RL4 transmits along a direction (e.g., a fourth direction D4) toward the first black matrix layer BM1.

Optionally, the method of reducing color breakup of reflection of ambient light further includes at least partially absorbing the fourth reflected light beam RL4 by the first black matrix layer BM1.

Because a portion of ambient light reflected by the plurality of lens portions LP can be absorbed by the first black matrix layer BM1, a portion of ambient light reflected by the elements in the display panel and transmitting out of the display panel is reduced, which may reduce the color breakup and other problems due to the reflection of ambient light.

Figure 6B:
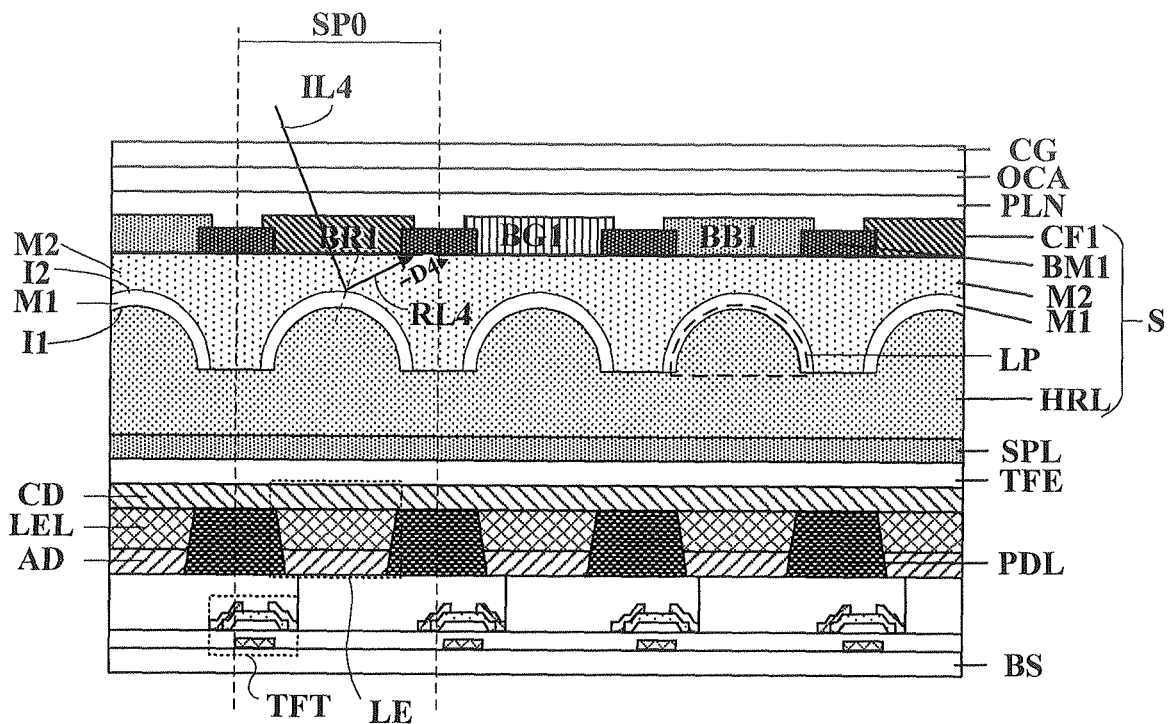
FIG. 6B is a schematic diagram illustrating reflection of ambient light in a display panel in some embodiments according to the present disclosure.

FIG. 6B is a schematic diagram illustrating reflection of ambient light in a display panel in some embodiments according to the present disclosure. In some embodiments, referring to FIG. 3B and FIG. 6B, the method of reducing color breakup of reflection of ambient light further includes reflecting the fourth incident ambient light beam IL4 at the second interface I2 to generate the fourth reflected light beam RL4. Optionally, the fourth reflected light beam RL4 transmits along the direction (e.g., the fourth direction D4) toward the first black matrix layer BM1.

Optionally, the second interface I2 is between the respective one of the plurality of cavity chambers CC (e.g., first medium M1) and the second medium M2 on a side of the respective one of the plurality of cavity chambers CC away from the respective one of the plurality of lens portions LP. Optionally, the second medium M2 is the low refractive index modulation layer LRL.

Subsequent to reflecting the fourth incident light beam IL4 using the second interface I2 to generate the fourth reflected light beam RL4, the light path thereafter is largely similar to or substantially the same as that described in connection with FIG. 6A after the generation of the fourth reflected light beam RL4.

Figure 6C:
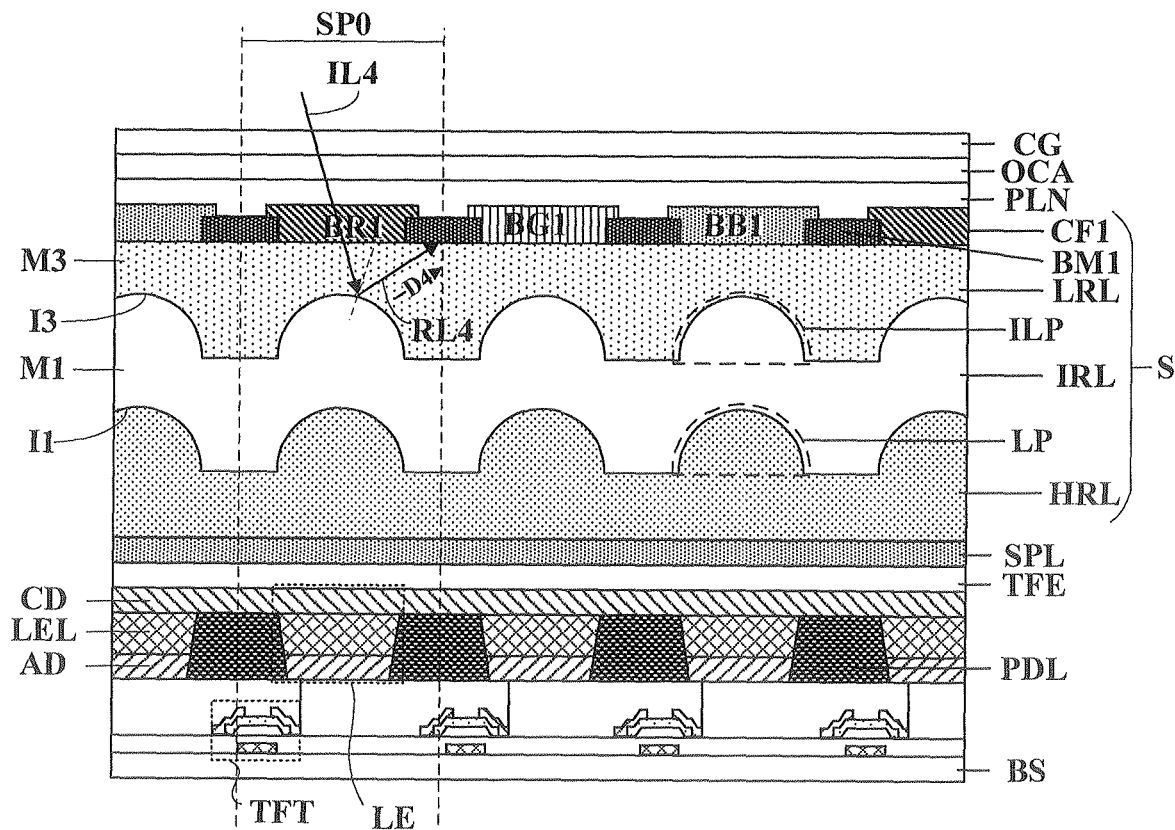
FIG. 6C is a schematic diagram illustrating reflection of ambient light in a display panel in some embodiments according to the present disclosure.

FIG. 6C is a schematic diagram illustrating reflection of ambient light in a display panel in some embodiments according to the present disclosure. In some embodiments, referring to FIG. 3C and FIG. 6C, the method of reducing color breakup of reflection of ambient light further includes reflecting the fourth incident ambient light beam IL4 at the third interface I3 to generate the fourth reflected light beam RL4. Optionally, the fourth reflected light beam RL4 transmits along the direction (e.g., the fourth direction D4) toward the first black matrix layer BM1.

Optionally, the third interface I3 is between a respective one of a plurality of intermediate lens portions ILP and a third medium M3 on a side of the intermediate refractive index lens layer IRL away from the respective one of the plurality of lens portions LP. Optionally, the third medium M3 is the low refractive index modulation layer LRL.

Subsequent to reflecting the fourth incident light beam IL4 using the third interface I3 to generate the fourth reflected light beam RL4, the light path thereafter is largely similar to or substantially the same as that described in connection with FIG. 6A after the generation of the fourth reflected light beam RL4.

Figure 7A:
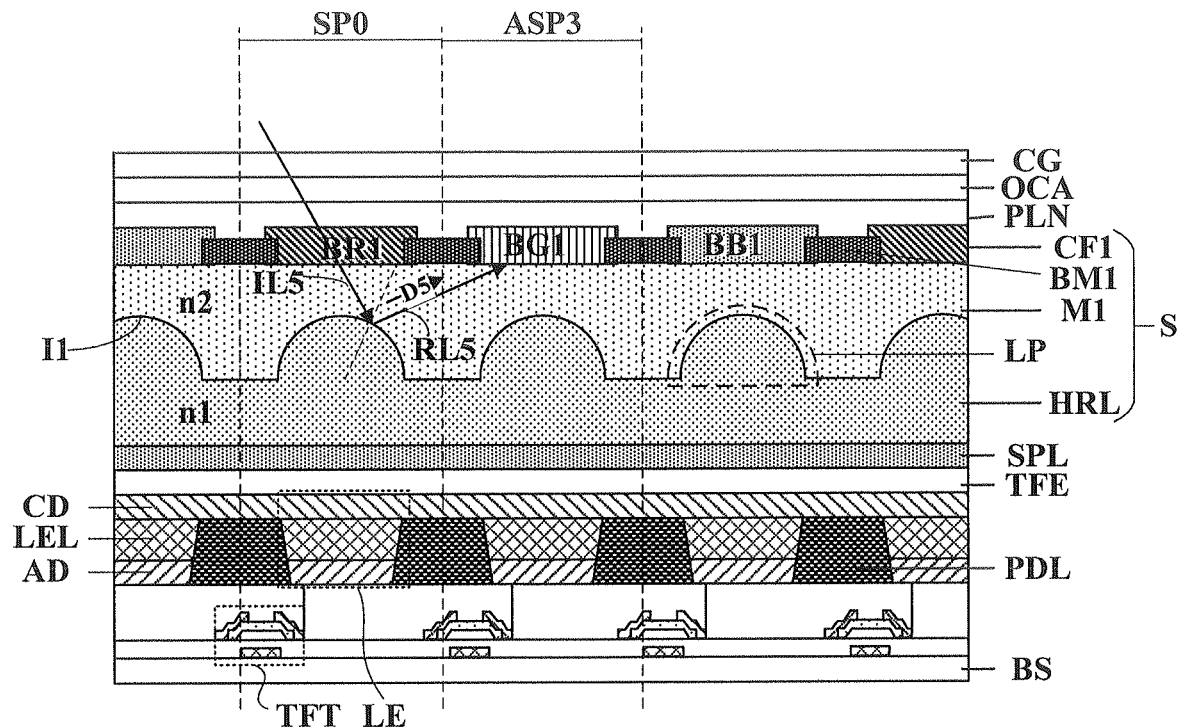
FIG. 7A is a schematic diagram illustrating reflection of ambient light in a display panel in some embodiments according to the present disclosure.

FIG. 7A is a schematic diagram illustrating reflection of ambient light in a display panel in some embodiments according to the present disclosure. In some embodiments, referring to FIG. 3A and FIG. 7A, the method of reducing color breakup of reflection of ambient light further includes reflecting a fifth incident ambient light beam IL5 at the first interface I1 to generate a fifth reflected light beam RL5. Optionally, the fifth reflected light beam RL5 transmits along a direction (e.g., a fifth direction D5) toward the first color filter layer CF1 in a third adjacent subpixel ASP3 adjacent to the subpixel SP0 having the respective one of the plurality of light emitting elements EL.

Optionally, the method of reducing color breakup of reflection of ambient light further includes at least partially absorbing the fifth reflected light beam RL5 by the first color filter layer CF1 in the third adjacent subpixel ASP3. In one example, the third adjacent subpixel ASP3 is immediately adjacent to the subpixel SP0 having the respective one of the plurality of light emitting elements LE. In another example, at least one subpixel is between the third adjacent subpixel ASP3 and the subpixel SP0 having the respective one of the plurality of light emitting elements LE.

Optionally, the first color filter layer CF1 in the third adjacent subpixel ASP3 has a color different from a color of the first color filter layer CF1 in the subpixel SP0 having the respective one of the plurality of light emitting elements EL, e.g., one of the plurality of color filter blocks corresponding to the third adjacent subpixel ASP3 has a color different from a color of the respective one of the plurality of color filter blocks corresponding to the respective one of the plurality of light emitting elements LE.

For example, the one of the plurality of color filter blocks corresponding to the third adjacent subpixel ASP3 has a green color (e.g., one of the plurality of color filter blocks in green color BG1), the respective one of the plurality of color filter blocks corresponding to the respective one of the plurality of light emitting elements LE has a red color (e.g., one of the plurality of color filter blocks in red color BR1). After an ambient light transmit through the respective one of the plurality of color filter blocks (e.g., one of the plurality of color filter blocks in red color BR1) corresponding to the respective one of the plurality of light emitting elements LE to generate the fifth incident ambient light beam IL5, the fifth incident ambient light beam IL5 has the color (e.g., red) of the respective one of the plurality of color filter blocks. The fifth reflected light beam RL5 also has a same color (e.g., red) as the fifth incident ambient light beam IL5. When the fifth reflected light beam RL5 hits one of the plurality of color filter blocks (e.g., one of the plurality of color filter blocks in green color BG1) corresponding to the third adjacent subpixel ASP3, the color (e.g., red) of the fifth reflected light beam RL5 is different from the color (e.g., green) of the one of the plurality of color filter blocks (e.g., one of the plurality of color filter blocks in green color BG1) corresponding to the third adjacent subpixel ASP3, so, the fifth reflected light beam RL5 is absorbed by the one of the plurality of color filter blocks corresponding to the third adjacent subpixel ASP3, which prevents the fifth reflected light beam RL5 from transmitting out of the display panel, and reduces the color breakup and other problems due to the reflection of ambient light.

Figure 7B:
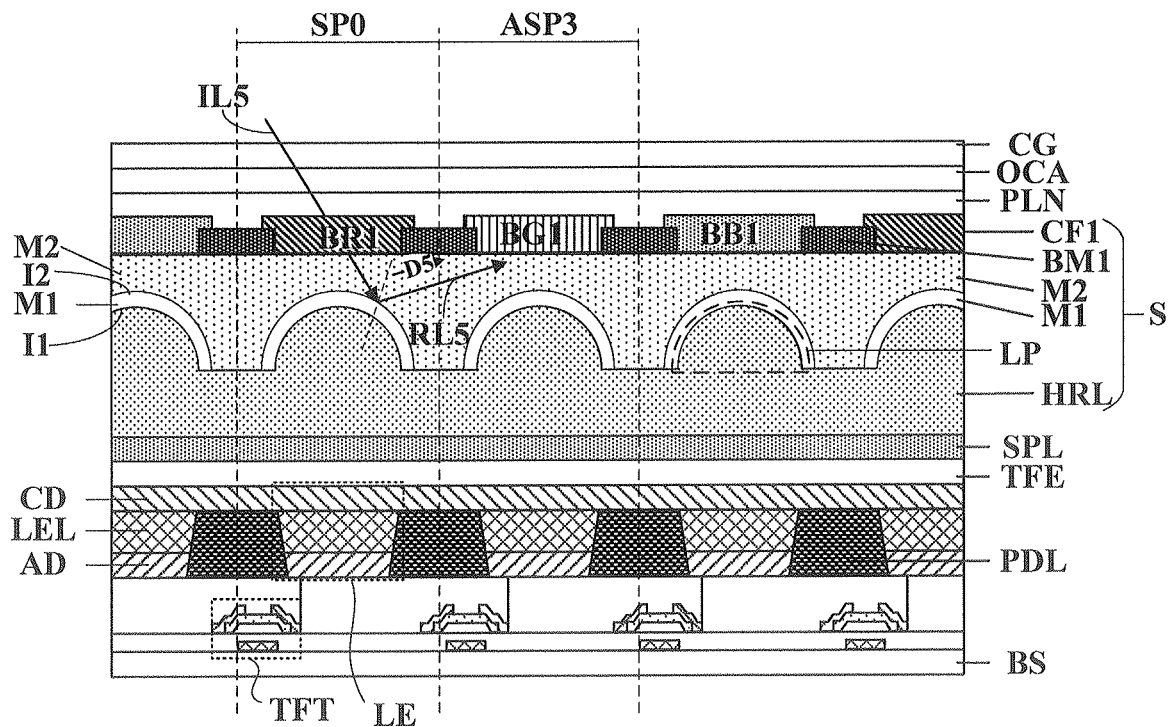
FIG. 7B is a schematic diagram illustrating reflection of ambient light in a display panel in some embodiments according to the present disclosure.

FIG. 7B is a schematic diagram illustrating reflection of ambient light in a display panel in some embodiments according to the present disclosure. In some embodiments, referring to FIG. 3B and FIG. 7B, the method of reducing color breakup of reflection of ambient light further includes reflecting the fifth incident ambient light beam IL5 at the second interface I2 to generate the fifth reflected light beam RL5. Optionally, the fifth reflected light beam RL5 transmits along a direction (e.g., a fifth direction D5) toward the first color filter layer CF1 in the third adjacent subpixel ASP3 adjacent to the subpixel SP0 having the respective one of the plurality of light emitting elements EL.

Optionally, the second interface I2 is between the respective one of the plurality of cavity chambers CC and the second medium M2 on a side of the respective one of the plurality of cavity chambers CC away from the respective one of the plurality of lens portions LP. Optionally, the second medium M2 is the low refractive index modulation layer LRL.

Subsequent to reflecting the fifth incident light beam IL5 using the second interface I2 to generate the fifth reflected light beam RL5, the light path thereafter is largely similar to or substantially the same as that described in connection with FIG. 7A after the generation of the fifth reflected light beam RL5.

Figure 7C:
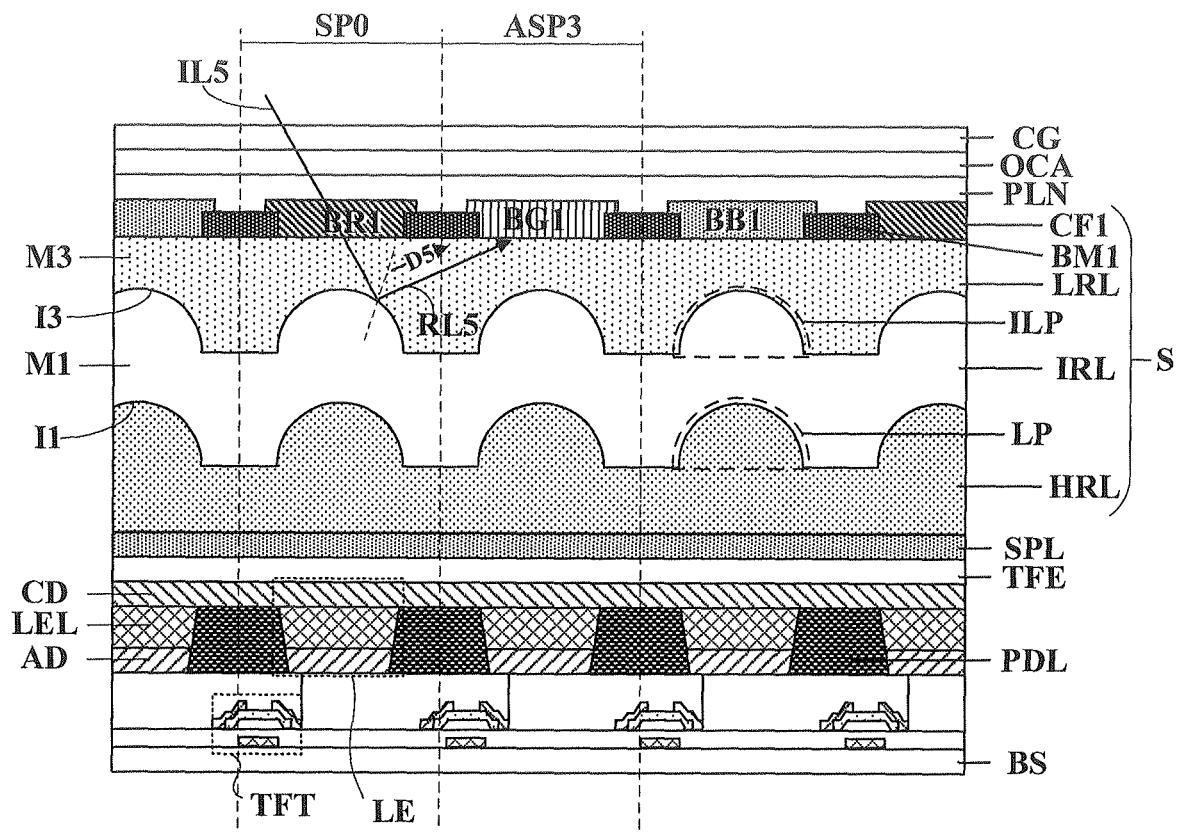
FIG. 7C is a schematic diagram illustrating reflection of ambient light in a display panel in some embodiments according to the present disclosure.

FIG. 7C is a schematic diagram illustrating reflection of ambient light in a display panel in some embodiments according to the present disclosure. In some embodiments, referring to FIG. 3C and FIG. 7C, the method of reducing color breakup of reflection of ambient light further includes reflecting the fifth incident ambient light beam IL5 at the third interface I3 to generate the fifth reflected light beam RL5. Optionally, the fifth reflected light beam RL5 transmits along a direction (e.g., a fifth direction D5) toward the first color filter layer CF1 in the third adjacent subpixel ASP3 adjacent to the subpixel SP0 having the respective one of the plurality of light emitting elements EL.

Optionally, the third interface I3 is between a respective one of a plurality of intermediate lens portions ILP and a third medium M3 on a side of the intermediate refractive index lens layer IRL away from the respective one of the plurality of lens portions LP. Optionally, the third medium M3 is the low refractive index modulation layer LRL.

Subsequent to reflecting the fifth incident light beam IL5 using the third interface I3 to generate the fifth reflected light beam RL5, the light path thereafter is largely similar to or substantially the same as that described in connection with FIG. 7A after the generation of the fifth reflected light beam RL5.

Figure 8A:
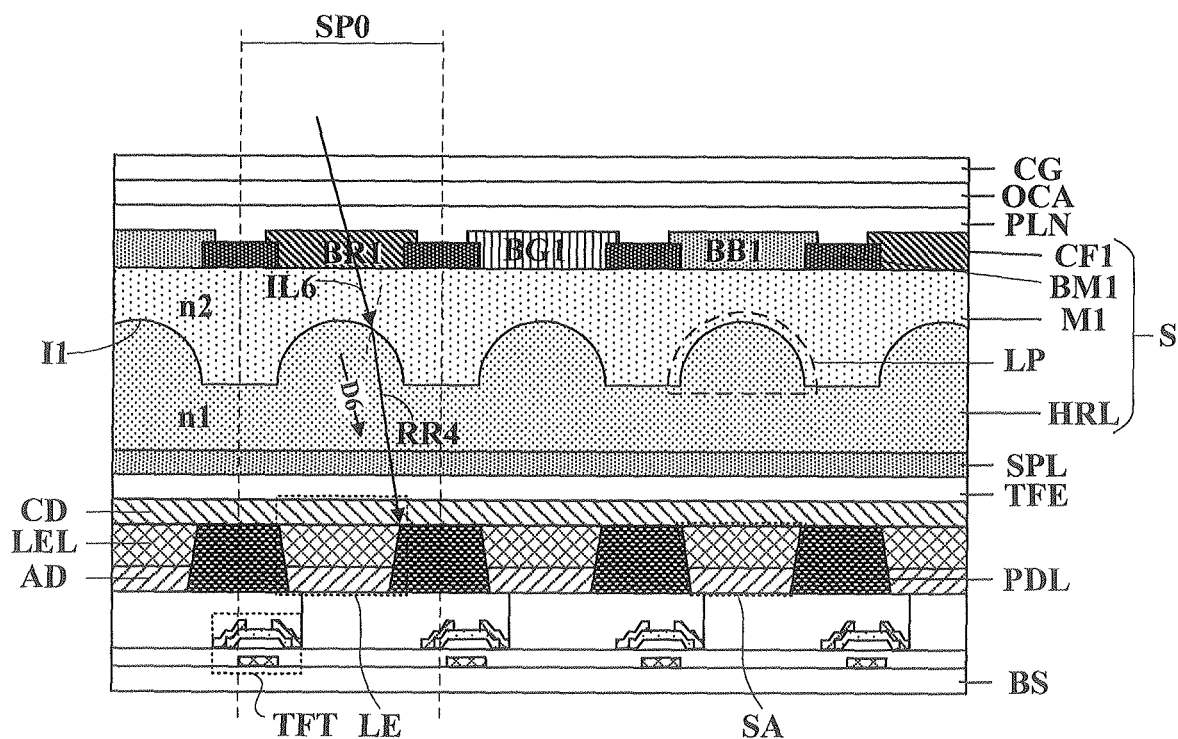
FIG. 8A is a schematic diagram illustrating reflection of ambient light in a display panel in some embodiments according to the present disclosure.

FIG. 8A is a schematic diagram illustrating reflection of ambient light in a display panel in some embodiments according to the present disclosure. In some embodiments, referring to FIG. 3A and FIG. 8A, the method of reducing color breakup of reflection of ambient light further includes refracting a sixth incident ambient light beam IL6 at the first interface I1 to generate a fourth refracted light beam RR4. Optionally, the fourth refracted light beam RR4 transmits along a direction (e.g., a sixth direction D6) toward a pixel definition layer PDL defining a plurality of subpixel apertures SA respectively in a plurality of subpixels SP.

Optionally, the method of reducing color breakup of reflection of ambient light further includes at least partially absorbing the fourth refracted light beam RR4 by the pixel definition layer PDL. Optionally, the pixel definition layer is made of a light absorbing material (e.g., a light absorbing black material).

A portion of the ambient light transmitting into the display panel may be absorbed by the pixel definition layer PDL, which prevents the portion of the ambient light from transmitting out of the display panel, and reduces the color breakup and other problems due to the reflection of ambient light.

Figure 8B:
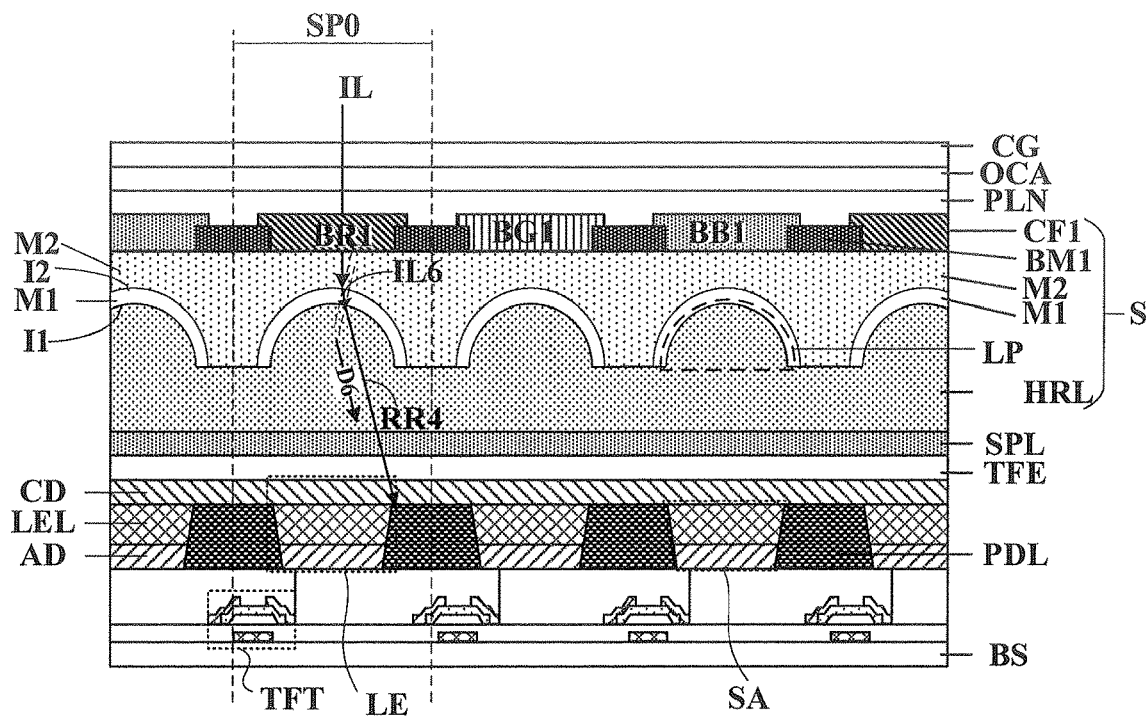
FIG. 8B is a schematic diagram illustrating reflection of ambient light in a display panel in some embodiments according to the present disclosure.

FIG. 8B is a schematic diagram illustrating reflection of ambient light in a display panel in some embodiments according to the present disclosure. In some embodiments, referring to FIG. 3B and FIG. 8B, prior to refracting the sixth incident ambient light beam IL6 at the first interface I1, the method of reducing color breakup of reflection of ambient light further includes refracting the incident ambient light beam IL at the second interface I2 to generate the sixth incident ambient light beam IL6.

Optionally, the second interface I2 is between the respective one of the plurality of cavity chambers CC and the second medium M2 on a side of the respective one of the plurality of cavity chambers CC away from the respective one of the plurality of lens portions LP. Optionally, the second medium M2 is the low refractive index modulation layer LRL. Optionally, the first interface I1 is between the respective one of the plurality of lens portions and the first medium M1 on a side of the respective one of the plurality of lens portions away from the respective one of the plurality of light emitting elements LE. Optionally, the first medium M1 is the plurality of cavity chambers CC.

Subsequent to generation of the sixth incident ambient light beam IL6, the sixth incident ambient light beam IL6 enters the respective one of the plurality of lens portions LP. The light path thereafter is largely similar to or substantially the same as that described in connection with FIG. 8A after the sixth incident ambient light beam IL6 enters the respective one of the plurality of lens portions LP.

Figure 8C:
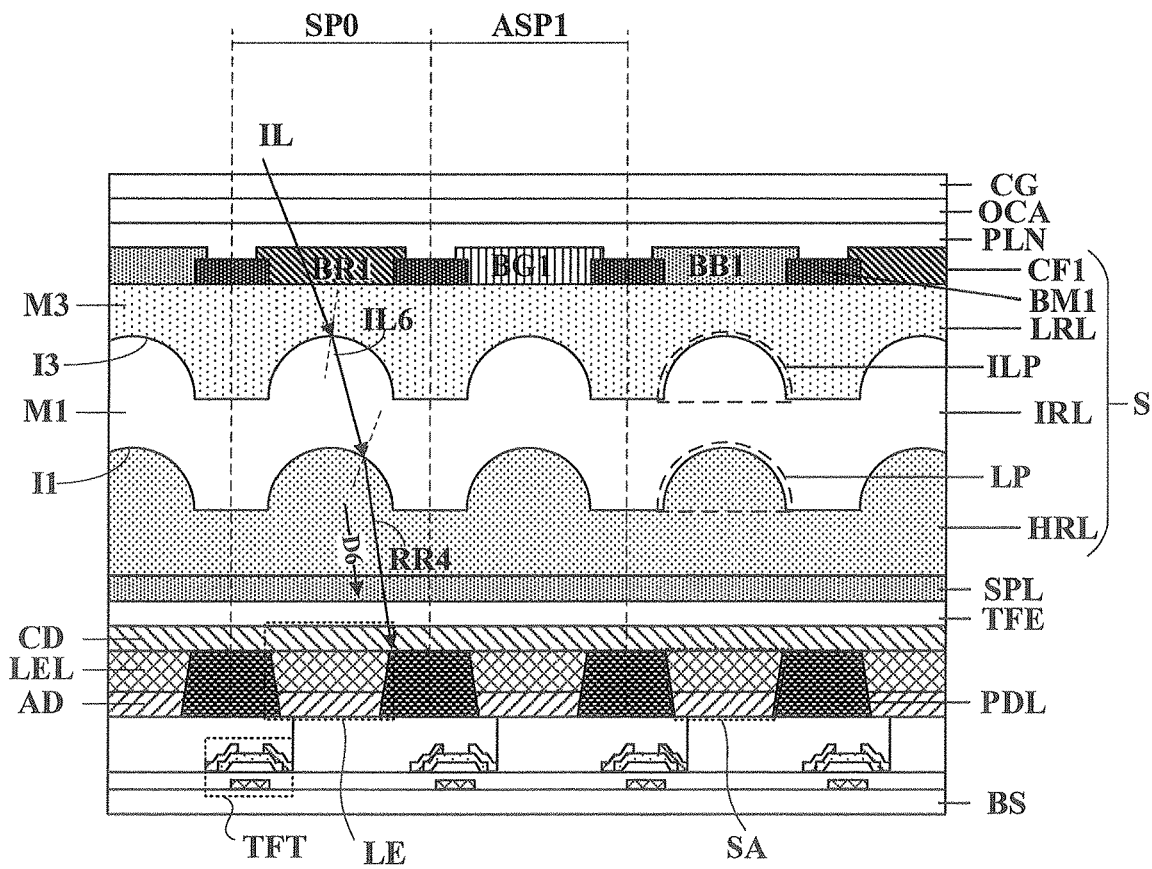
FIG. 8C is a schematic diagram illustrating reflection of ambient light in a display panel in some embodiments according to the present disclosure.

FIG. 8C is a schematic diagram illustrating reflection of ambient light in a display panel in some embodiments according to the present disclosure. In some embodiments, referring to FIG. 3B and FIG. 8C, prior to refracting the sixth incident ambient light beam IL6 at the first interface I1, the method of reducing color breakup of reflection of ambient light further includes refracting the incident ambient light beam IL at the third interface I3 to generate the sixth incident ambient light beam IL6.

Optionally, the first interface I1 is between the plurality of lens portions LP and the first medium M1 on a side of the respective one of the plurality of lens portions LP away from the respective one of the plurality of light emitting elements LE. Optionally, the first medium M1 is the intermediate refractive index lens layer IRL having the plurality of intermediate lens portion ILP. Optionally, the third interface I3 is between a respective one of a plurality of intermediate lens portions ILP and a third medium M3 on a side of the intermediate refractive index lens layer IRL away from the respective one of the plurality of lens portions LP. Optionally, the third medium M3 is the low refractive index modulation layer LRL.

Subsequent to generation of the sixth incident ambient light beam IL6, the sixth incident ambient light beam IL6 enters the respective one of the plurality of lens portions LP. The light path thereafter is largely similar to or substantially the same as that described in connection with FIG. 5A after the sixth incident ambient light beam IL6 enters the respective one of the plurality of lens portions LP.

Figure 9A:
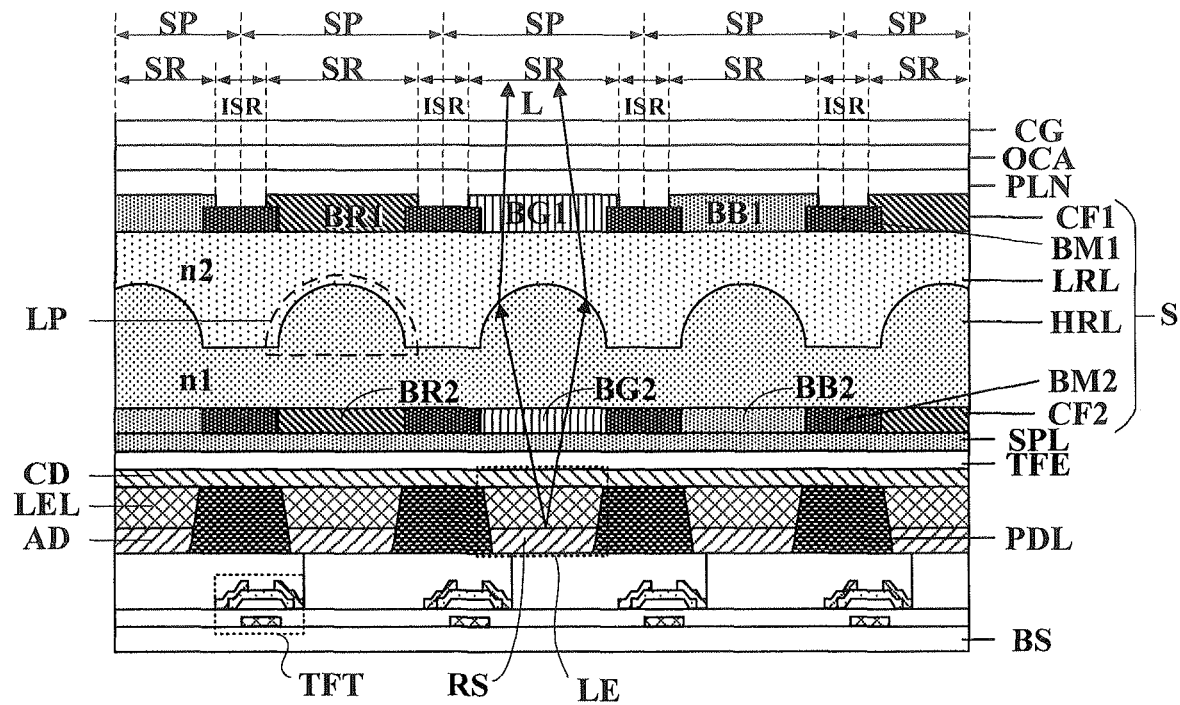
FIG. 9A is a schematic diagram illustrating reflection of ambient g in a display panel in some embodiments according to the present disclosure.
Figure 9B:
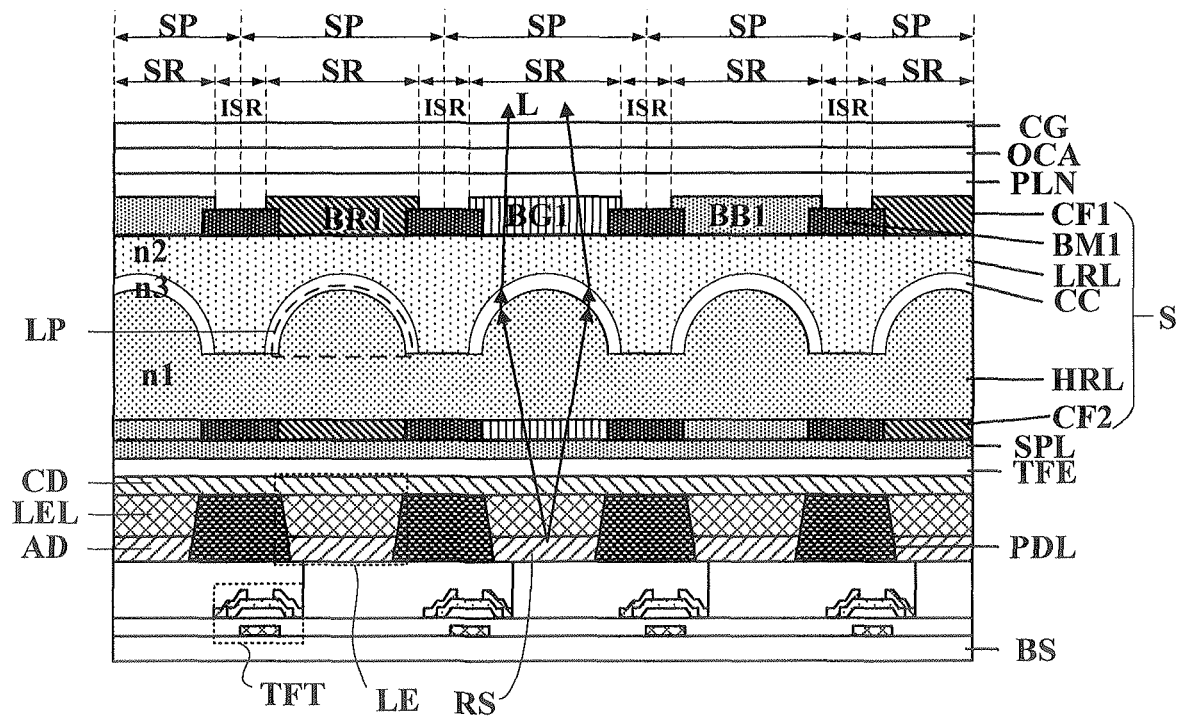
FIG. 9B is a schematic diagram illustrating reflection of ambient light in a display panel in some embodiments according to the present disclosure.
Figure 9C:
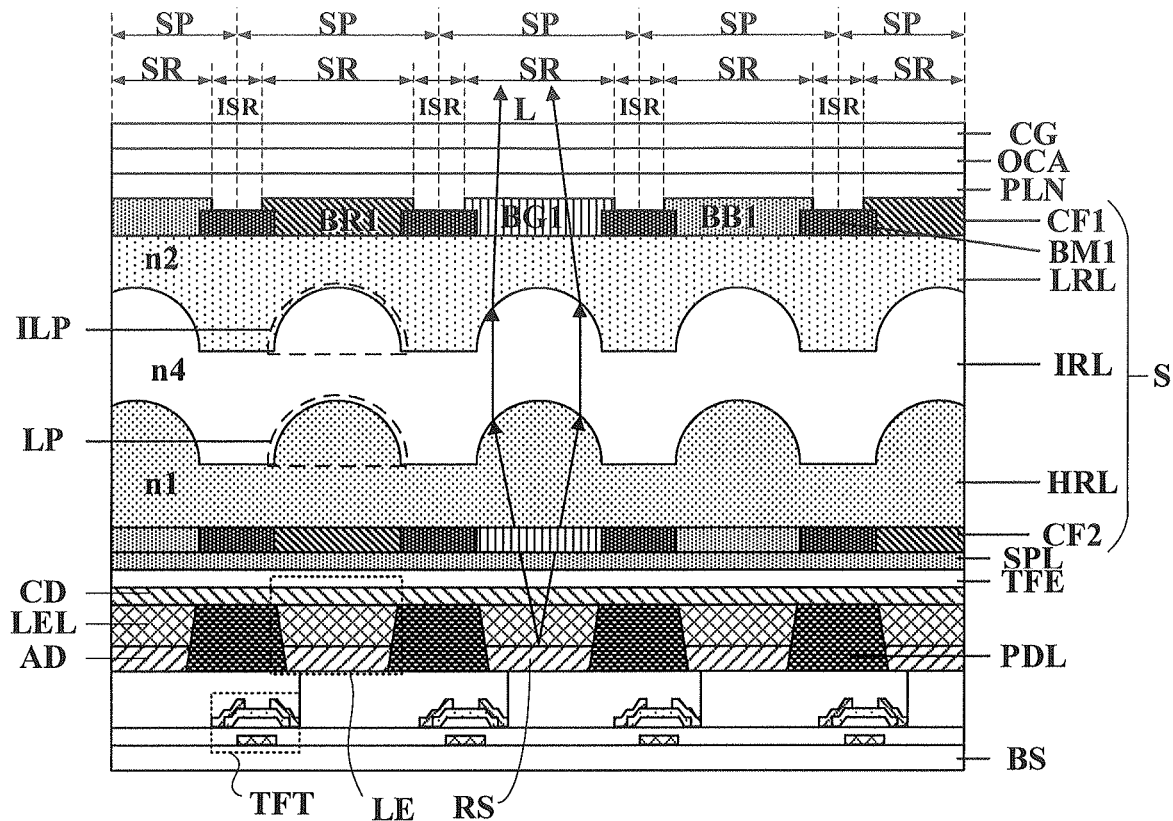
FIG. 9C is a schematic diagram illustrating reflection of ambient light in a display panel in some embodiments according to the present disclosure.

FIG. 9A to FIG. 9C are schematic diagrams of a structure of a display panel in some embodiments according to the present disclosure. In some embodiments, referring to FIG. 9A to FIG. 9C, the color breakup-prevention structure S further includes a second color filter layer CF2 in the plurality of subpixel regions SR, and spaced apart from the low refractive index modulation layer LRL by the high refractive index lens layer HRL; and a second black matrix layer BM2 in the inter-subpixel region ISR, and spaced apart from the low refractive index modulation layer LRL by the high refractive index lens layer HRL.

Optionally, the second color filter layer CF2 includes a plurality of second color filter blocks B respectively in the plurality of subpixels SP. For example, the plurality of second color filter blocks B includes a plurality of second color filter blocks in red color BR2, a plurality of second color filter blocks in green color BG2, and a plurality of second color filter blocks in blue color BB2.

Optionally, in a same subpixel, a color of the first color filter layer CF1 and a color of the second color filter layer CF2 are the same, e.g., in the same subpixel, the color of the respective one of the plurality of second color filter blocks is the same as the color of the respective one of the plurality of color filter blocks.

In some embodiments, referring to FIG. 9A, a light beam L is emitted from the respective one of the plurality of light emitting elements LE and transmits along a direction away from the base substrate BS and toward the second color filter layer CF2 and the first color filter layer CF1. Optionally, the light beam L is converged by at least the respective one of the plurality of lens portions LP to enhance light extraction of the display panel. Optionally, two color filter layers (e.g., the second color filter layer CF2 and the first color filter layer CF1) may increase the color purity of the light beam L transmitted out of the display panel.

Figure 10:
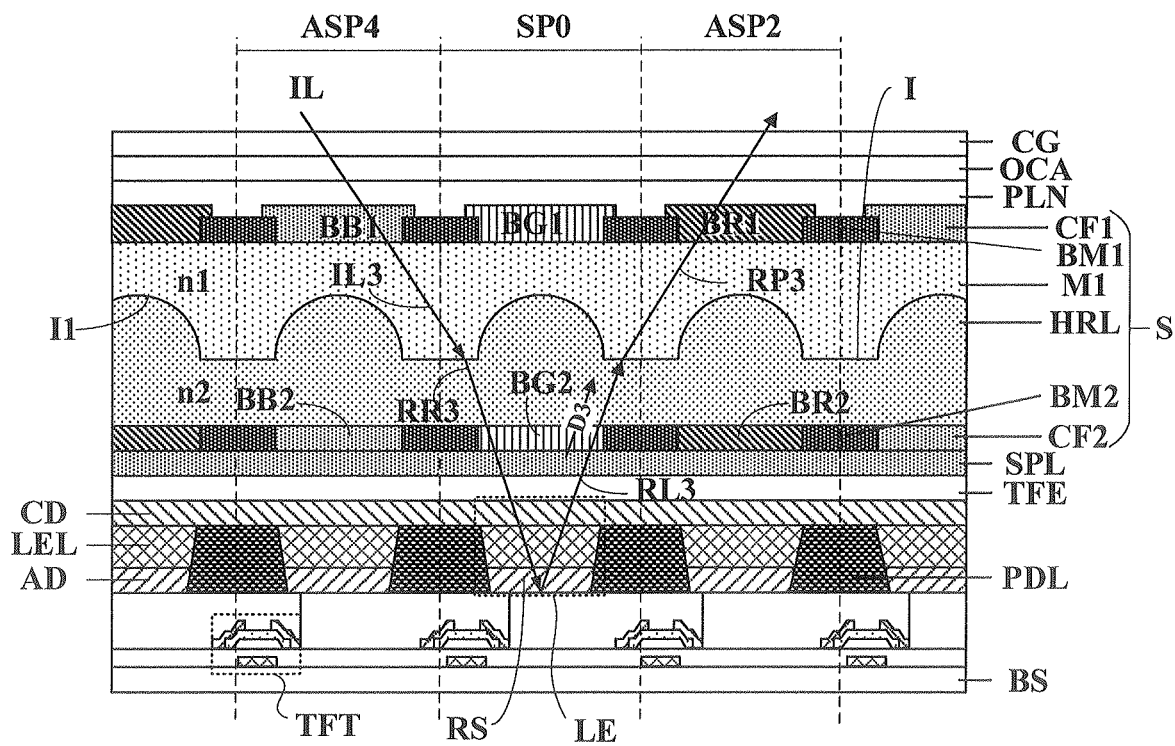
FIG. 10 is a schematic diagram illustrating reflection of ambient light in a display panel in some embodiments according to the present disclosure.

FIG. 10 is a schematic diagram illustrating reflection of ambient light in a display panel in some embodiments according to the present disclosure. In some embodiments, referring to FIG. 9A and FIG. 10, the method of reducing color breakup of reflection of ambient light further includes refracting a third incident ambient light beam IL3 at an interface between the high refractive index lens layer HRL and the first medium M1, to generate a third refracted light beam RR3 having a direction altered from the direction of the light beam (e.g., the third incident ambient light beam IL3) in the first medium M1. Optionally, the third incident ambient light beam IL3 is originated from an incident ambient light beam IL transmitting through the first color filter CF1 in a fourth adjacent subpixel ASP4. In one example, the fourth adjacent subpixel ASP4 is immediately adjacent to the subpixel SP0 having the respective one of the plurality of light emitting elements LE. In another example, at least one subpixel is between the fourth adjacent subpixel ASP4 and the subpixel SP0 having the respective one of the plurality of light emitting elements LE.

Optionally, the method of reducing color breakup of reflection of ambient light further includes at least partially absorbing the third refracted light beam RR3 by the second color filter layer CF2 in the subpixel SP0 having the respective one of the plurality of light emitting elements LE.

Optionally, the method of reducing color breakup of reflection of ambient light further includes reflecting the third refracted light beam RR3 by the reflective structure RS in the respective one of the plurality of light emitting elements EL to generate a third reflected light beam RL3. Optionally, the third reflected light beam RL3 transmits along a direction (e.g., a third direction D3) toward a second adjacent subpixel ASP2 adjacent to the subpixel SP0 having the respective one of the plurality of light emitting elements LE. In one example, the second adjacent subpixel ASP2 is immediately adjacent to the subpixel SP0 having the respective one of the plurality of light emitting elements LE. In another example, at least one subpixel is between the second adjacent subpixel ASP2 and the subpixel SP0 having the respective one of the plurality of light emitting elements LE.

Optionally, the method of reducing color breakup of reflection of ambient light further includes at least partially absorbing the third reflected light beam RL3 by the second color filter layer CF2 in the subpixel SP0 having the respective one of the plurality of light emitting elements LE. Optionally, the method of reducing color breakup of reflection of ambient light further includes at least partially absorbing the third reflected light beam RL3 by the second black matrix layer BM2.

Optionally, the method of reducing color breakup of reflection of ambient light further includes continuing transmitting the third reflected light beams RL3 through at least the first medium M1, resulting in a third residual portion RP3 arriving at the first color filter layer CF1 in the second adjacent subpixel ASP2. Optionally, the first medium M1 is the low refractive index modulation layer LRL.

Optionally, at least two colors among the color of the second color filter layer CF2 in the subpixel SP0 having the respective one of the plurality of light emitting elements LE, the color of the first color filter layer CF1 in the second adjacent subpixel ASP2, and the color of the first color filter layer CF1 in the fourth adjacent subpixel ASP4 are different.

In one example, the first color filter layer CF1 in the second adjacent subpixel ASP2 has a color different from a color of the second color filter layer CF2 in the subpixel SP0 having the respective one of the plurality of light emitting elements LE. In another example, the first color filter layer CF1 in the second adjacent subpixel ASP2 has a color different from a color of first color filter layer CF1 in the fourth adjacent subpixel ASP4. In another example, the color of the second color filter layer CF2 in the subpixel SP0 having the respective one of the plurality of light emitting elements LE, the color of the first color filter layer CF1 in the second adjacent subpixel ASP2, and the color of the first color filter layer CF1 in the fourth adjacent subpixel ASP4 are different from each other.

Figure 11:
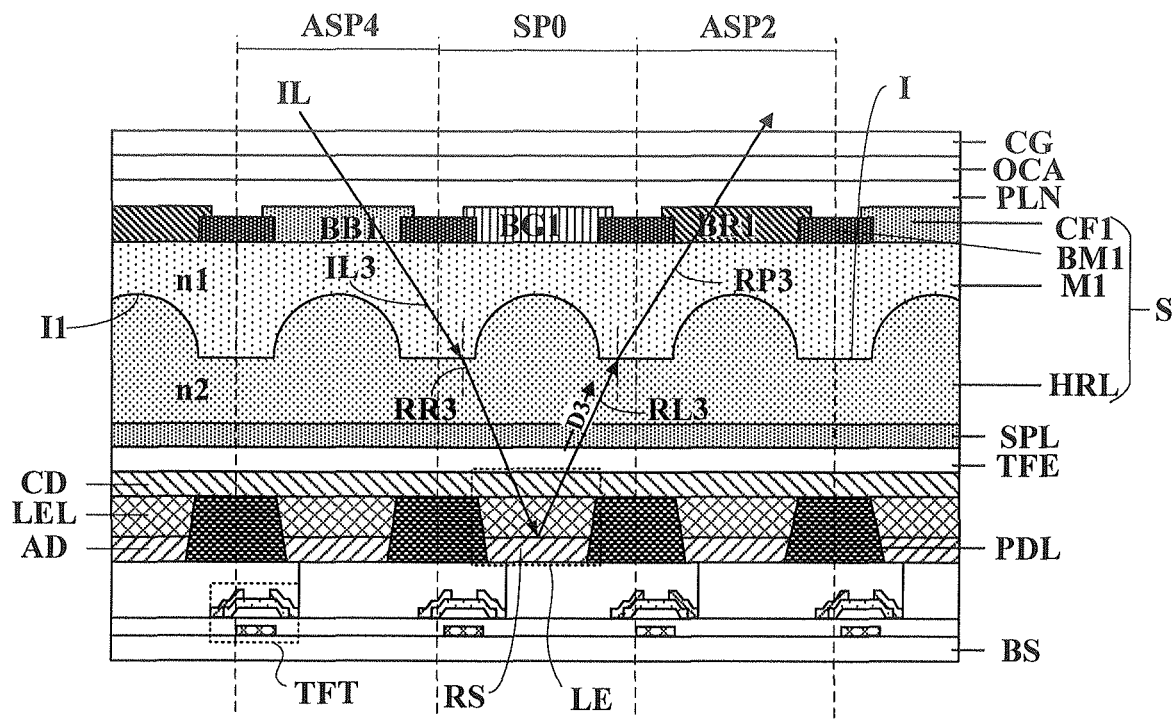
FIG. 11 is a schematic diagram illustrating reflection of ambient light in a display panel in some embodiments according to the present disclosure.

FIG. 11 is a schematic diagram illustrating reflection of ambient light in a display panel in some embodiments according to the present disclosure. Comparing FIG. 11 with FIG. 10, the display panel in FIG. 10 has the second color filter layer CF2, but the display panel in FIG. 11 is absent of the second color filter layer CF2. Referring to FIG. 10, a light path formed by an incident ambient light beam, a resulting refracted light beam, a resulting reflected light beam, and a residual portion of the resulting reflected light beam transmits through four color filters, e.g., the incident ambient light beam transmits thought the first color filter, the resulting refracted light beam transmits through the second color filter, the resulting reflected light beam transmits through the second color filter, and the residual portion of the resulting reflected light beam transmits through the first color filter. Referring to FIG. 11, the light path formed by the incident ambient light beam, the resulting refracted light beam, the resulting reflected light beam, and the residual portion of the resulting reflected light beam transmits through two color filters, e.g., the incident ambient light beam transmits through the first color filter, and the residual portion of the resulting reflected light beam transmits through the first color filter. More color filters in a light path may help to prevent a larger portion of the incident ambient light from being reflected out of the display panel, which may reduce the color breakup and other problems due to the reflection of ambient light.

For example, referring to FIG. 10 and FIG. 11, the color of the second color filter layer CF2 in the subpixel SP0 having the respective one of the plurality of light emitting elements LE is green color; the color of the first color filter CF1 in the second adjacent subpixel ASP2 is red color; and the color of the first color filter CF1 in the fourth adjacent subpixel ASP4 is blue color. When the incident ambient light beam IL transmits thought the first color filter CF1 in the fourth adjacent subpixel ASP4, a large portion of red light constituting the incident ambient light beam IL is filtered by the blue color of the first color filter CF1 in the fourth adjacent subpixel ASP4. There is still a small portion of red light of the incident ambient light beam IL remains. Referring to FIG. 11, without the second color filter CF2, the small portion of the red light will transmit to the first color filter CF1 in the second adjacent subpixel ASP2, since the color of the first color filter CF1 in the second adjacent subpixel ASP2 is in red color, the first color filter CF1 in red color will not filter the red light, so, the small portion of red light will continue transmitting through the first color filter CF1 in the second adjacent subpixel ASP2, which will also lead to color breakup and color interruption. Referring to FIG. 10, since the display panel has the second color filter CF2, the small portion of the red light will be filtered and absorbed by the second color filter CF2, resulting a much more smaller portion of the red light or none of the red light transmits toward the first color filter CF1 in the second adjacent subpixel ASP2. Therefore, the amount of red light transmitting out of the second adjacent subpixel ASP2 in FIG. 10 is smaller than the amount of red light transmitting out of the second adjacent subpixel ASP2 in FIG. 11. The effect of reducing the color breakup and color interruption is significantly improved in display panel shown in FIG. 10.

Figure 12:
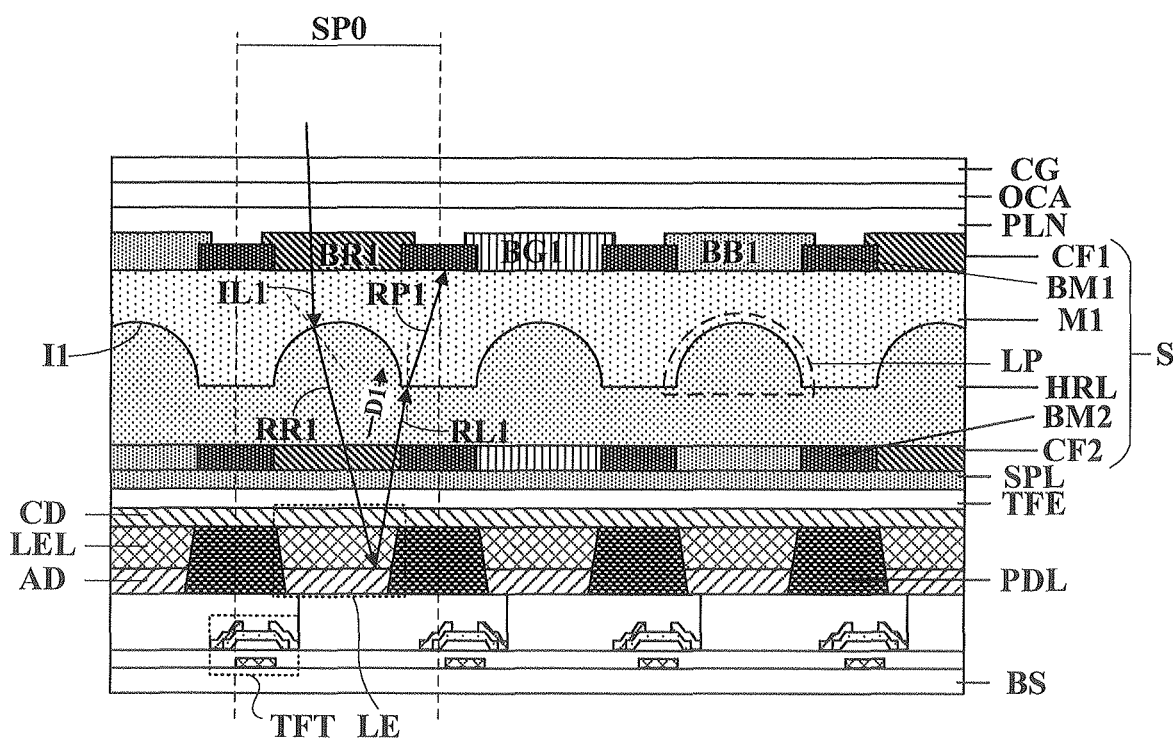
FIG. 12 is a schematic diagram illustrating reflection of ambient light in a display panel in some embodiments according to the present disclosure.

FIG. 12 is a schematic diagram illustrating reflection of ambient light in a display panel in some embodiments according to the present disclosure. Referring to FIG. 9A and FIG. 12, in some embodiments, the method of reducing color breakup of reflection of ambient light includes refracting a first incident ambient light beam IL1 at a first interface I1 between a respective one of the plurality of lens portions LP and a first medium M1 on a side of the respective one of the plurality of lens portions LP away from the respective one of the plurality of light emitting elements LE, to generate a first refracted light beam RR1 having a direction altered from a direction of a light beam (e.g., the first incident ambient light beam IL1) in the first medium M1. Optionally, the first medium M1 is the low refractive index modulation layer LRL.

Optionally, the method of reducing color breakup of reflection of ambient light further includes reflecting the first refracted light beam RR1 by a reflective structure RS in a respective one of the plurality of light emitting elements LE to generate a first reflected light beam RL1. Optionally, prior to reflecting the first refracted light beam RR1, the first refracted light beam RR1 is filtered by the second color filter layer CF2. Optionally, subsequent to generating the first reflected light beam RL1, the first reflected light beam RL1 is filtered by the second color filter layer CF2.

Optionally, the method of reducing color breakup of reflection of ambient light further includes continuing transmitting the first reflected light beam RL1 through at least the first medium M1, resulting in a first residual portion RP1 arriving at the first black matrix layer BM1. For example, the first reflected light beam RL1 transmits along the first direction D1 toward the first black matrix layer BM1. Optionally, the reflective structure RS is the anode AD of the respective one of the plurality of light emitting elements LE.

Optionally, the method of reducing color breakup of reflection of ambient light further includes at least partially absorbing the first residual portion RP1 of the first reflected light beam RL1 by the first black matrix layer BM1.

Because the first residual portion RP1 of the first reflected light beam RL1 is filtered by the second color filter CF2 and absorbed by the first black matrix layer BM1, a portion of ambient light reflected by elements in the display panel (e.g., the plurality of light emitting elements LE) will not be transmitted out of the display panel, which may reduce the color breakup and other problems due to the reflection of ambient light.

Figure 13:
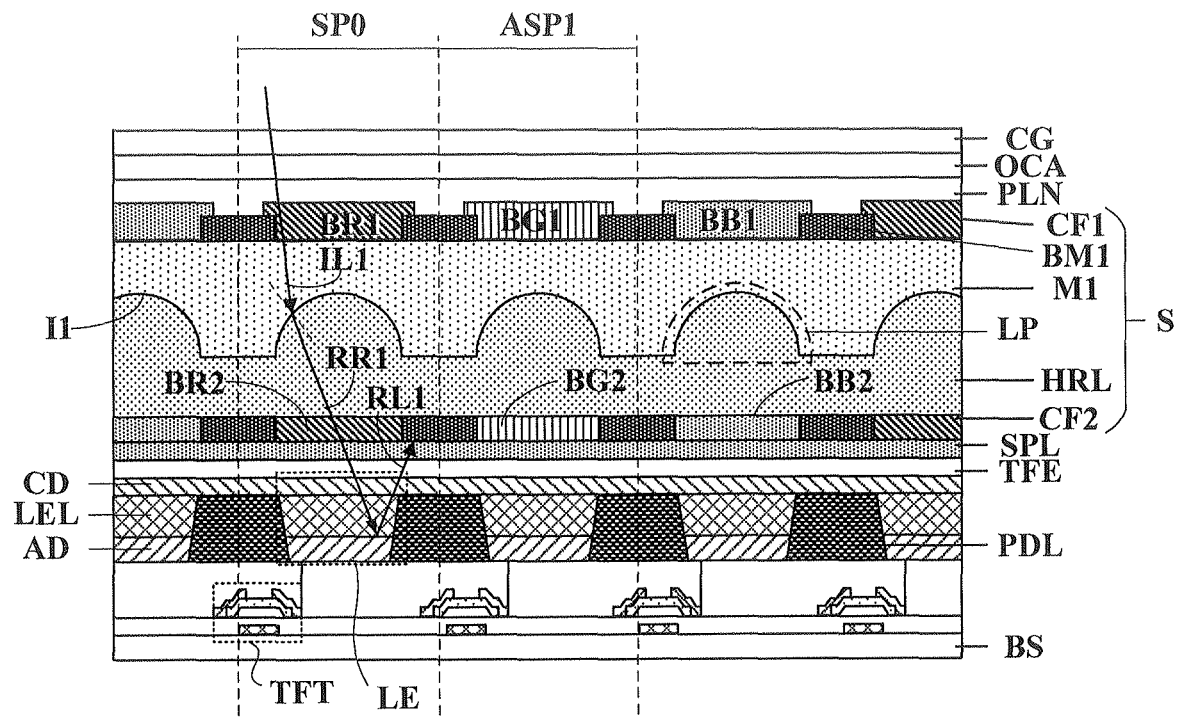
FIG. 13 is a schematic diagram illustrating reflection of ambient light in a display panel in some embodiments according to the present disclosure.

FIG. 13 is a schematic diagram illustrating reflection of ambient light in a display panel in some embodiments according to the present disclosure. Referring to FIG. 9A and FIG. 13, optionally, subsequent to generating the reflected light beam RL1, the reflected light beam RL1 is absorbed by the second black matrix layer BM2.

Figure 14:
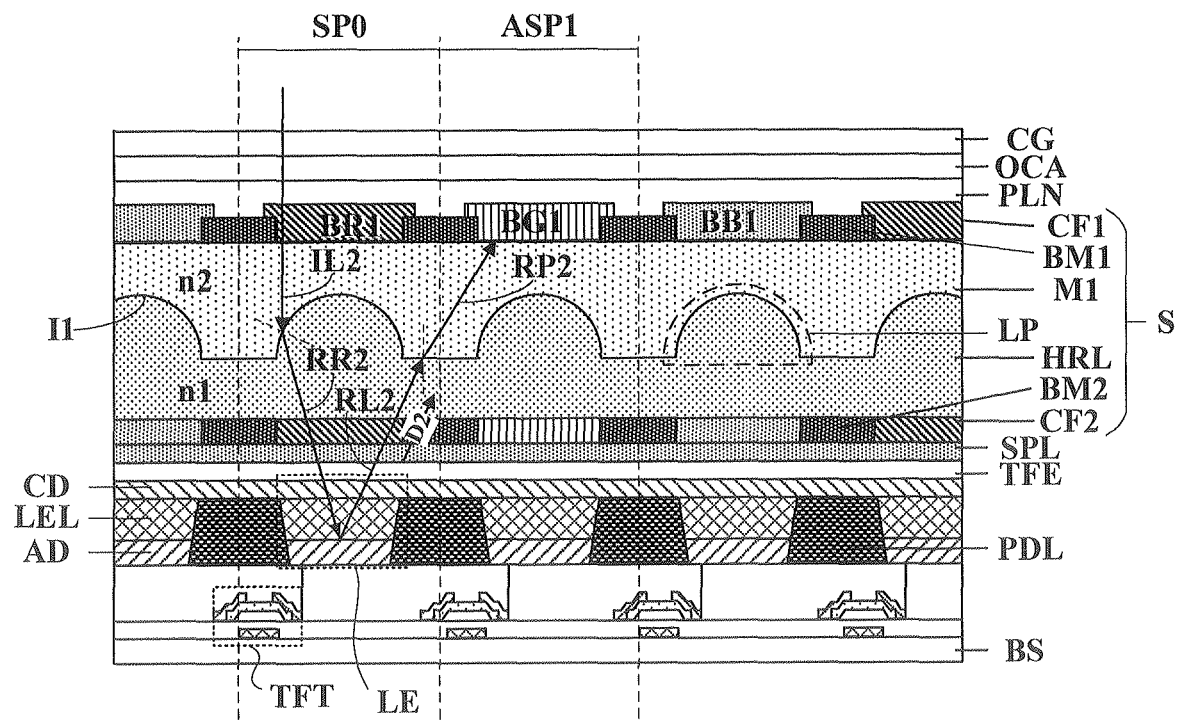
FIG. 14 is a schematic diagram illustrating reflection of ambient light in a display panel in some embodiments according to the present disclosure.

FIG. 14 is a schematic diagram illustrating reflection of ambient light in a display panel in some embodiments according to the present disclosure. Referring to FIG. 9A and FIG. 14, in some embodiments, the method of reducing color breakup of reflection of ambient light further includes refracting a second incident ambient light beam IL2 at the first interface I1, to generate a second refracted light beam RR2 having a direction altered from the direction of the light beam e.g., second incident ambient light beam IL2) in the first medium M1. Optionally, the first medium M1 is the low refractive index modulation layer LRL.

Optionally, the method of reducing color breakup of reflection of ambient light further includes reflecting the second refracted light beam RR2 by the reflective structure RS in the respective one of the plurality of light emitting elements LE to generate a second reflected light beam RL2. Optionally, prior to reflecting the second refracted light beam RR2, the second refracted light beam RR2 is filtered by the second color filter layer CF2. Optionally, subsequent to generating the second reflected light beam RL2, the second reflected light beam RL2 is filtered by the second color filter layer CF2.

Optionally, the method of reducing color breakup of reflection of ambient light further includes continuing transmitting the second reflected light beam RL2 through at least the first medium M1, resulting in a second residual portion RP2 arriving at the first color filter layer CF1 in a first adjacent subpixel ASP1 adjacent to a subpixel SP0 having the respective one of the plurality of light emitting elements LE. For example, the subpixel SP0 having the respective one of the plurality of light emitting elements LE corresponds to a respective one of the plurality of color filter blocks through which an ambient light transmits, and the second incident ambient light beam IL2 is originated from the ambient light.

For example, the second reflected light beam RL2 transmits along a second direction D2 toward the first color filter layer CF1 in the first adjacent subpixel ASP1 adjacent to a subpixel SP0 having the respective one of the plurality of light emitting elements LE.

In one example, the first adjacent subpixel ASP1 is immediately adjacent to the subpixel SP0 having the respective one of the plurality of light emitting elements LE. In another example, at least one subpixel is between the first adjacent subpixel ASP1 and the subpixel SP0 having the respective one of the plurality of light emitting elements LE.

Optionally, the method of reducing color breakup of reflection of ambient light further includes at least partially absorbing the second residual portion RP2 of the second reflected light beam RL2 by the first color filter layer CF1 in the first adjacent subpixel ASP1.

Optionally, the first color filter layer CF1 in the first adjacent subpixel ASP1 has a color different from a color of the first color filter layer in the subpixel SP0 having the respective one of the plurality of light emitting elements LE. Optionally, in the same subpixel, the first color filter layer CF1 has a same color as the second filter layer CF2, e.g., the respective one of the plurality of color filter blocks of the first color filter layer CF1 has a same color as a respective one of the plurality of second color filter blocks of the second filter layer CF2. For example, one of the plurality of color filter blocks corresponding to the first adjacent subpixel ASP1 has a color different from a color of the respective one of the plurality of color filter blocks corresponding to the respective one of the plurality of light emitting elements LE.

For example, the one of the plurality of color filter blocks of the first color filter layer CF1 corresponding to the first adjacent subpixel ASP1 has a green color (e.g., one of the plurality of color filter blocks in green color BG1), the respective one of the plurality of color filter blocks corresponding to the respective one of the plurality of light emitting elements LE has a red color (e.g., one of the plurality of color filter blocks in red color BR1) and the respective one of the plurality of second color filter blocks of the second filter layer CF2 corresponding to the respective one of the plurality of light emitting elements LE has a red color (e.g., one of the plurality of second color filter blocks in red color BR2). After an incident ambient light beam IL transmits through the respective one of the plurality of color filter blocks (e.g., one of the plurality of color filter blocks in red color BR1) corresponding to the respective one of the plurality of light emitting elements LE to generate the second incident ambient light, the second incident ambient light beam IL2 has the color (e.g., red) of the respective one of the plurality of color filter blocks. The second refracted light beam RR2 and the second reflected light beam RL2 also have a same color (e.g., red) as the second incident light beam IL2. When the second residual portion RP2 of the second reflected light beam RL2 hits one of the plurality of color filter blocks (e.g., one of the plurality of color filter blocks in green color BG1) corresponding to the first adjacent subpixel ASP1, the color (e.g., red) of the second residual portion RP2 of the second reflected light beam RL2 is different from the color (e.g., green) of the one of the plurality of color filter blocks (e.g., one of the plurality of color filter blocks in green color BG1) corresponding to the first adjacent subpixel ASP1, so, the second residual portion RP2 of the second reflected light beam RL2 is absorbed by the one of the plurality of color filter blocks corresponding to the first adjacent subpixel ASP1, which prevents the second residual portion of the second reflected light beam from transmitting out of the display panel, and reduces the color breakup and other problems due to the reflection of ambient light.

Figure 15:
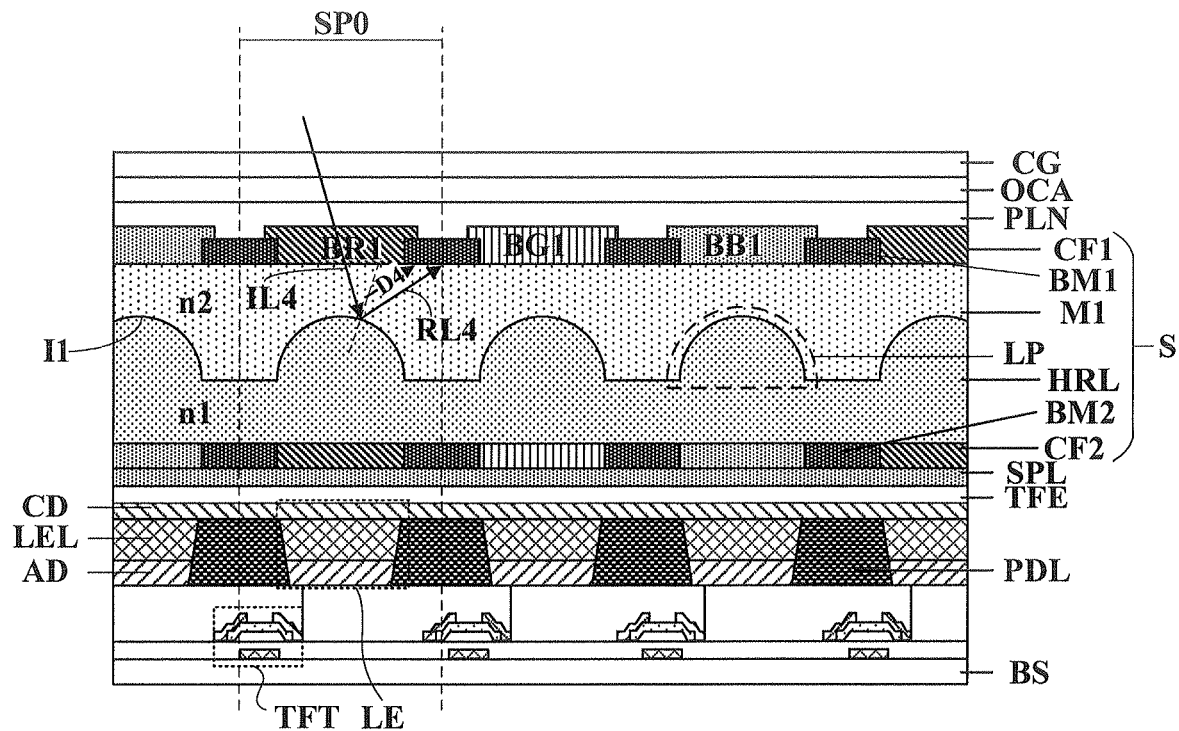
FIG. 15 is a schematic diagram illustrating reflection of ambient light in a display panel in some embodiments according to the present disclosure.

FIG. 15 is a schematic diagram illustrating reflection of ambient light in a display panel in some embodiments according to the present disclosure. Referring to FIG. 9A and FIG. 15, in some embodiments, the method of reducing color breakup of reflection of ambient light further includes reflecting a fourth incident ambient light beam IL4 at the first interface I1 to generate a fourth reflected light beam RL4. Optionally, the fourth reflected light beam RL4 transmits along a direction (e.g., a fourth direction D4) toward the first black matrix layer BM1.

Optionally, the method of reducing color breakup of reflection of ambient light further includes at least partially absorbing the fourth reflected light beam RL4 by the first black matrix layer BM1.

Because a portion of ambient light reflected by the plurality of lens portions can be absorbed by the first black matrix layer, a portion of ambient light reflected by the elements in the display panel and transmitting out of the display panel is reduced, which may reduce the color breakup and other problems due to the reflection of ambient light.

Figure 16:
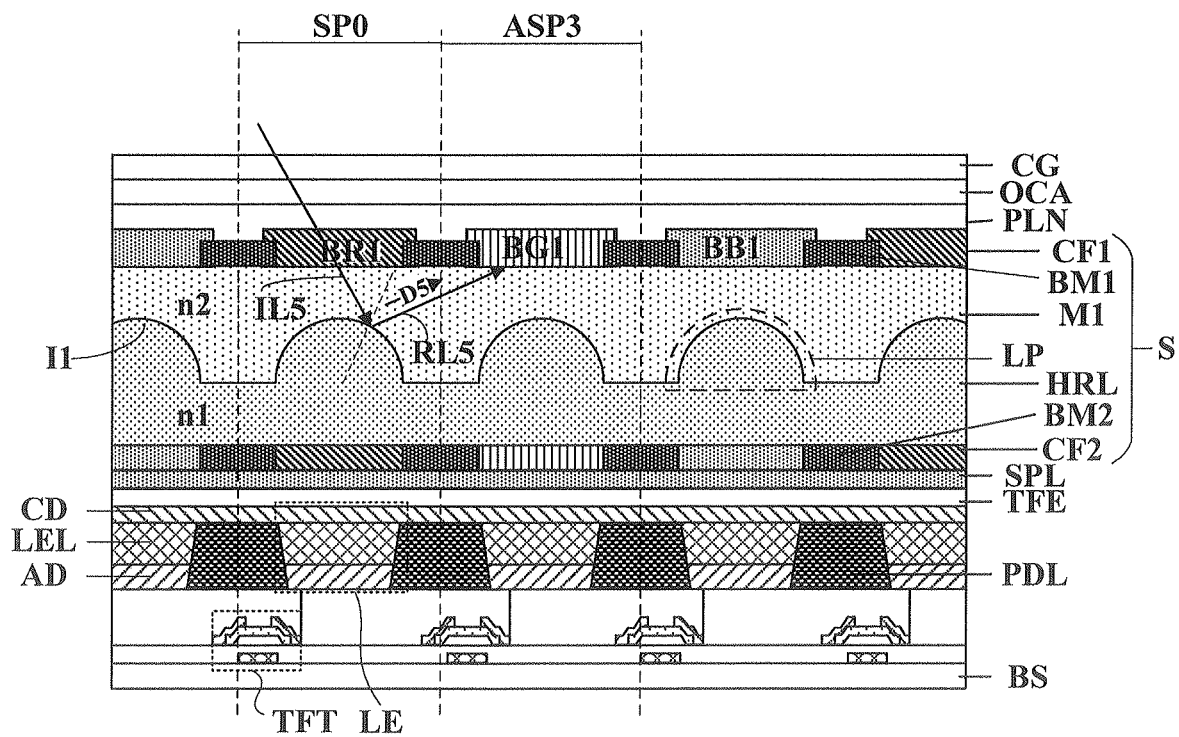
FIG. 16 is a schematic diagram illustrating reflection of ambient light in a display panel in some embodiments according to the present disclosure.

FIG. 16 is a schematic diagram illustrating reflection of ambient light in a display panel in some embodiments according to the present disclosure. Referring to FIG. 9A and FIG. 16, in some embodiments, the method of reducing color breakup of reflection of ambient light further includes reflecting a fifth incident ambient light beam IL5 at the first interface I1 to generate a fifth reflected light beam RL5. Optionally, the fifth reflected light beam RL5 transmits along a direction (e.g., a fifth direction D5) toward the first color filter layer CF1 in a third adjacent subpixel ASP3 adjacent to the subpixel SP0 having the respective one of the plurality of light emitting elements EL.

Optionally, the method of reducing color breakup of reflection of ambient light further includes at least partially absorbing the fifth reflected light beam RL5 by the first color filter layer CF1 in the third adjacent subpixel ASP3. In one example, the third adjacent subpixel ASP3 is immediately adjacent to the subpixel SP0 having the respective one of the plurality of light emitting elements LE. In another example, at least one subpixel is between the third adjacent subpixel ASP3 and the subpixel SP0 having the respective one of the plurality of light emitting elements LE.

Optionally, the first color filter layer CF1 in the third adjacent subpixel ASP3 has a color different from a color of the first color filter layer CF1 in the subpixel SP0 having the respective one of the plurality of light emitting elements EL. For example, one of the plurality of color filter blocks corresponding to the third adjacent subpixel ASP3 has a color different from a color of the respective one of the plurality of color filter blocks corresponding to the respective one of the plurality of light emitting elements LE. Optionally, the one of the plurality of color filter blocks corresponding to the third adjacent subpixel ASP3 has a green color (e.g., one of the plurality of color filter blocks in green color BG1), the respective one of the plurality of color filter blocks corresponding to the respective one of the plurality of light emitting elements LE has a red color (e.g., one of the plurality of color filter blocks in red color BR1).

For example, after the fifth incident ambient light beam IL5 transmits through the respective one of the plurality of color filter blocks (e.g., one of the plurality of color filter blocks in red color BR1) corresponding to the respective one of the plurality of light emitting elements LE, the fifth incident ambient light beam IL5 has the color (e.g., red) of the respective one of the plurality of color filter blocks. The fifth reflected light beam RL5 also has a same color (e.g., red) as the fifth incident ambient light beam IL5. When the fifth reflected light beam RL5 hits one of the plurality of color filter blocks (e.g., one of the plurality of color filter blocks in green color BG1) corresponding to the third adjacent subpixel ASP3, the color (e.g., red) of the fifth reflected light beam RL5 is different from the color (e.g., green) of the one of the plurality of color filter blocks (e.g., one of the plurality of color filter blocks in green color BG1) corresponding to the third adjacent subpixel ASP3, so, the fifth reflected light beam RL5 is absorbed by the one of the plurality of color filter blocks corresponding to the third adjacent subpixel ASP3, which prevents the fifth reflected light beam RL5 from transmitting out of the display panel, and reduces the color breakup and other problems due to the reflection of ambient light.

Figure 17:
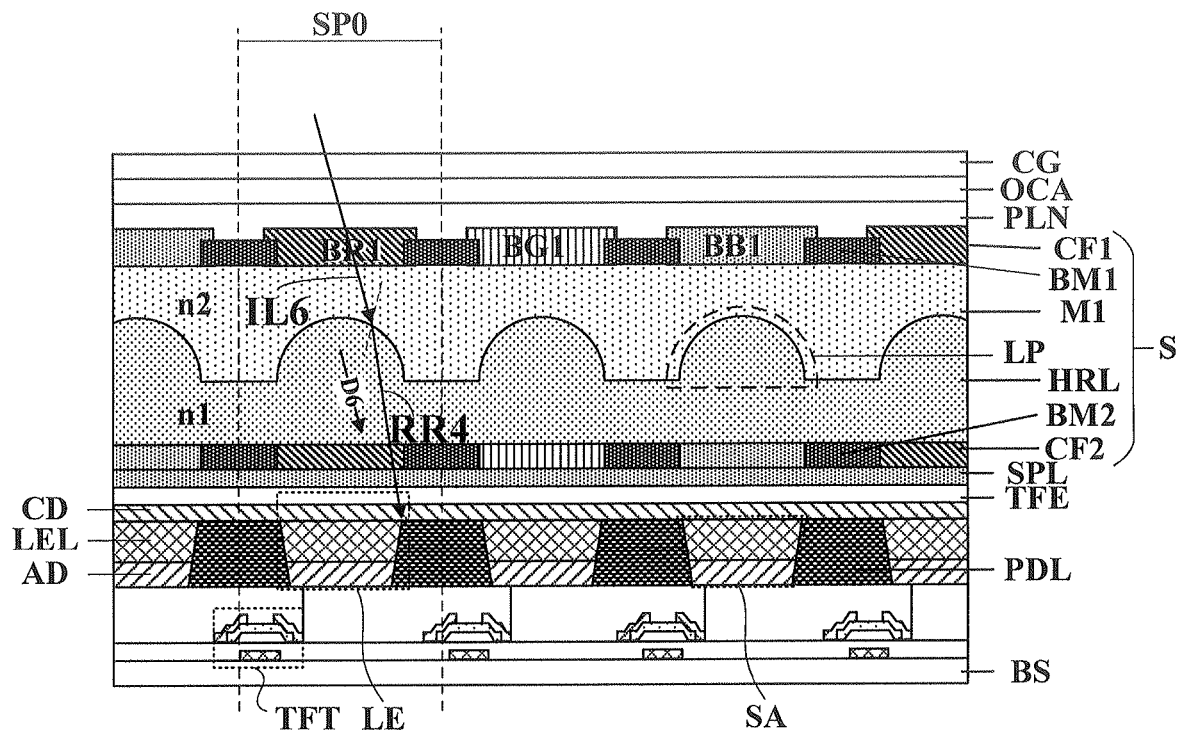
FIG. 17 is a schematic diagram illustrating reflection of ambient light in a display panel in some embodiments according to the present disclosure.

FIG. 17 is a schematic diagram illustrating reflection of ambient light in a display panel in some embodiments according to the present disclosure. Referring to FIG. 9A and FIG. 17, in some embodiments, the method of reducing color breakup of reflection of ambient light further includes refracting a sixth incident ambient light beam IL6 at the first interface I1 to generate a fourth refracted light beam RR4. Optionally, the fourth refracted light beam RR4 transmits along a direction (e.g., a sixth direction D6) toward a pixel definition layer PDL defining a plurality of subpixel apertures SA respectively in a plurality of subpixels SP.

Optionally, method of reducing color breakup of reflection of ambient light further includes at least partially filtering the fourth refracted light beam RR4 by the second color filter CF2 and absorbing the fourth refracted light beam RR4 by the pixel definition layer PDL. Optionally, the pixel definition layer is made of a light absorbing material.

A portion of the ambient light transmitting into the display panel may be filtered by the second color filter layer and be absorbed by the pixel definition layer PDL, which prevents the portion of the ambient light from transmitting out of the display panel, and reduces the color breakup and other problems due to the reflection of ambient light.

In another aspect, the present disclosure provides a display panel. Referring to FIGS. 3A, 4A, SA, 6A, 7A, 8A, 9A, and 10, the display panel includes a base substrate BS; a plurality of light emitting elements LE on the base substrate BS and respectively in a plurality of subpixels SP and a color breakup-prevention structure S configured to reduce color breakup of reflection of ambient light in the plurality of subpixels SP. Optionally, a respective one of the plurality of light emitting elements LE includes an anode AD, a cathode CD opposite to the anode AD, and a light emitting layer LEL between the anode AD and the cathode CD.

Optionally, the color breakup-prevention structure S includes a high refractive index lens layer HRL on a side of the plurality of light emitting elements LE away from the base substrate BS; a low refractive index modulation layer LRL on a side of the high refractive index lens layer HRL away from the base substrate BS; a first color filter layer CF1 in a plurality of subpixel regions SR, and spaced apart from the high refractive index lens layer HRL by the low refractive index modulation layer LRL; and a first black matrix layer BM1 in an inter-subpixel region ISR, and spaced apart from the high refractive index lens layer HRL by the low refractive index modulation layer LRL.

Optionally, the first color filter layer CF1 includes a plurality of color filter blocks B respectively in the plurality of subpixels SP. For example, the plurality of color filter blocks includes a plurality of color filter blocks in red color BR1, a plurality of color filter blocks in green color BG1, and a plurality of color filter blocks in blue color BB1. Optionally, a respective one of the plurality of color filter blocks has a light transmissive portion LTP surrounded by the first black matrix layer BM1.

Optionally, in a cross-section intersecting a respective one of the plurality of lens portions LP and a respective one of the plurality of color filter blocks B in a same subpixel, the light transmissive portion LIP has a first width w1, the respective one of the plurality of lens portions LP has a diameter w2 and a height h, w2>w1, and 0.5 w2<h<w2.

In one example, the cross-section of a respective one of the plurality of lens portions LP is a portion of a substantially circular shape. Optionally, the cross-section of a respective one of the plurality of lens portions LP is a substantially semicircular shape. Optionally, the diameter w2 of the respective one of the plurality of lens portion LP is in a range of 15 um to 100 um, e.g., 15 um to 35 um, 35 um to 55 um, 55 um to 75 um, 75 um to 95 um, and 95 um to 100 um, for example, the diameter w2 of the respective one of the plurality of lens portion LP is 40 um. Optionally, the height h of the diameter w2 of the respective one of the plurality of lens portion LP is in a range of 2 um to 60 um, e.g., 2 um to 20 um, 20 um to 40 um, and 40 um to 60 um, for example, the height h of the diameter w2 of the respective one of the plurality of lens portion LP is 22 um. Optionally, the first width w1 is in a range of 15 um to 100 um, e.g., 15 um to 35 um, 35 um to 55 um, 55 um to 75 um, 75 um to 95 um, and 95 um to 100 um, for example, the first width w1 is 34 um.

In another example, the cross-section of a respective one of the plurality of lens portions LP is a portion of a substantially elliptical shape. Optionally, the cross-section of a respective one of the plurality of lens portions LP is a substantially semi-elliptical shape. Optionally, the diameter w2 of the respective one of the plurality of lens portion LP is in a range of 15 um to 100 um, e.g., 15 um to 35 um, 35 um to 55 um, 55 um to 75 um, 75 um to 95 um, and 95 um to 100 um, for example, the diameter w2 of the respective one of the plurality of lens portion LP is 40 um. Optionally, the height h of the diameter w2 of the respective one of the plurality of lens portion LP is in a range of 2 um to 60 um, e.g., 2 um to 20 um, 20 um to 40 um, and 40 um to 60 um, for example, the height h of the diameter w2 of the respective one of the plurality of lens portion LP is 26 um. Optionally, the first width w1 is in a range of 15 um to 100 um, e.g., 15 um to 35 um, 35 um to 55 um, 55 um to 75 um, 75 um to 95 um, and 95 um to 100 um, for example, the first width w1 is 34 um. Optionally, h>0.5 w2.

Optionally, the high refractive index lens layer HRL has a first refractive index n1. Optionally, the low refractive index modulation layer LRL has a second refractive index n2 smaller than the first refractive index n1, For example, a difference between the first refractive index n1 and the second refractive index n2 increases, the refractive light beam refracted at the first interface I1 has a smaller refraction angle with respect to a same incident angle, so that the refracted light will transmit along a direction having a relatively larger deviation with respect to the direction of the incident light.

Optionally, the first refractive index n1 is in a range of 1.2 to 2.8, e.g., 1.2 to 1.6, 1.6 to 2.0, 2.0 to 2.4, and 2.4 to 2.8. Optionally, the second refractive index n2 is in a range of 0.2 to 2, e.g., 0.2 to 0.6, 0.6 to 1.0, 1.0 to 1.4, 1.4 to 1.8, and 1.8 to 2. For example, the first refractive index n1 is 1.85, and the second refractive index n2 is 1.18.

Optionally, a thickness of the high refractive index lens layer HRL is in a range of 2.2 um to 100 um, e.g., 2.2 um to 20 um, 20 um to 40 um, 40 um to 60 um, 60 um to 80 um, and 80 um to 100 um, for example, the thickness of the high refractive index lens layer HRL is 15.5 um. Optionally, a thickness of the low refractive index modulation layer LRL is in a range of 2.2 um to 100 um, e.g., 2.2 um to 20 um, 20 um to 40 um, 40 um to 60 um, 60 um to 80 um, and 80 um to 100 um, for example, the thickness of the low refractive index modulation layer LRL is 10 um.

Optionally, the low refractive index modulation layer LRL, is substantially transparent and substantially free of a chromogenic material. Optionally, the high refractive index lens layer HRL includes a plurality of lens portions LP spaced apart from each other and respectively in the plurality of subpixels SP.

Various appropriate material may be used for forming the high refractive index lens layer. Examples of materials suitable for forming the high refractive index lens layer include, but are not limited to, thermosetting resin, phenolic resin, polydimethylsiloxane (PDMS), polyethylene naphthalate (PEN), polyimide (PI), polyetherimide (PEI), polyparaphenylene ethylene glycolate (PET), polyphenylene sulfide (PPS), oxides doped with IZO, IGZO, $AL_2O_3$, organic-inorganic hybrid molecular composite, silsesquioxane-polyurethane and its derivatives, and resin doped with SiNx and SiOxNy.

Various appropriate material may be used for forming the low refractive index lens layer. Examples of materials suitable for forming the low refractive index lens layer include, but are not limited to, modified epoxy resin, acrylic resin, or resin-doped polydimethylsiloxane (PDMS), polyethylene naphthalate (PEN), polyimide (PI) doped with silver nanowires, polyetherimide (PEI), polyethylene terephthalate (PET), polyphenylene sulfide (PPS).

In some embodiments, referring to FIG. 3A, the display panel further includes an encapsulating layer TFE encapsulating the plurality of light emitting elements LE; and a spacing planarization layer SPL on a side of the encapsulating layer TFE away from the plurality of light emitting elements LE. Optionally, the high refractive index lens layer HRL is spaced part from the plurality of light emitting elements LE by the spacing planarization layer SPL and the encapsulating layer TFE.

In some embodiments, the display panel further includes a pixel definition layer PDL defining a plurality of subpixel apertures SA respectively in a plurality of subpixels SP. Optionally, the pixel definition layer PDL is made of a light absorbing material.

In some embodiments, referring to FIG. 9A to FIG. 9C, the color breakup-prevention structure S further includes a second color filter layer CF2 in the plurality of subpixel regions SR, and spaced apart from the low refractive index modulation layer LRL by the high refractive index lens layer HRL; and a second black matrix layer BM2 in the inter-subpixel region ISR, and spaced apart from the low refractive index modulation layer LRL by the high refractive index lens layer HRL.

Optionally, the second color filter layer CF2 includes a plurality of second color filter blocks respectively in the plurality of subpixels SP. For example, the plurality of second color filter blocks includes a plurality of second color filter blocks in red color BR2, a plurality of second color filter blocks in green color BG2, and a plurality of second color filter blocks in blue color BB2.

Optionally, in a same subpixel, a color of the first color filter layer CF1 and a color of the second color filter layer CF2 are the same. Optionally, in the same subpixel, the color of the respective one of the plurality of second color filter blocks is the same as the color of the respective one of the plurality of color filter blocks.

In some embodiments, referring to FIG. 3B, and FIG. 9B, the color breakup-prevention structure S further includes a plurality of cavity chambers CC. Optionally, the plurality of cavity chambers CC are spaced apart from each other, and respectively cover the plurality of lens portions LP. Optionally, the respective one of the plurality of cavity chambers CC spaces apart the respective one of the plurality of lens portions LP from the low refractive index modulation layer LRL.

Optionally, the respective one of the plurality of cavity chambers CC has a third refractive index n3 smaller than the second refractive index n2. Optionally, the refractive index n3 is smaller than the first refractive index n1. For example, the first refractive index n1 is 1.85, the second refractive index n2 is 1.18, and the third refractive index n3 is 1.0.

Since the respective one of the plurality of cavity chambers are added in the light path of the light beam and n3 is smaller than n2, a difference between n3 and n1 is greater than a difference between n2 and n1, the light extraction efficiency of the display panel is increased, and the likelihood that an ambient light is reflected out of the display panel is reduced.

In some embodiments, referring to FIG. 3C and FIG. 9C, the color breakup-prevention structure S further includes an intermediate refractive index lens layer IRL between the high refractive index lens layer HRL and the low refractive index modulation layer LRL. Optionally, the intermediate refractive index lens layer IRL includes a plurality of intermediate lens portions ILP spaced apart from each other and respectively in the plurality of subpixels SP.

Optionally, the intermediate refractive index lens layer IRL has a fourth refractive index n4 between the first refractive index n1 and the second refractive index n2.

Optionally, the first refractive index n1 is in a range of 1.2 to 2.8, e.g., 1.2 to 1.6, 1.6 to 2.0, 2.0 to 2.4, and 2.4 to 2.8. Optionally, the second refractive index n2 is in a range of 0.2 to 2, e.g., 0.2 to 0.6, 0.6 to 1.0, 1.0 to 1.4, 1.4 to 1.8, and 1.8 to 2. Optionally, the fourth refractive index n4 is in a range of 1.2 to 2.8, e.g., 1.2 to 1.6, 1.6 to 2.0, 2.0 to 2.4, and 2.4 to 2.8. For example, the first refractive index n1 is 2.35, the second refractive index n2 is 1.18, and the fourth refractive index n4 is 1.85.

Optionally, a thickness of the high refractive index lens layer HRL is in a range of 2.2 um to 100 um, e.g., 2.2 um to 20 um, 20 um to 40 um, 40 um to 60 um, 60 um to 80 um, and 80 um to 100 um, for example, the thickness of the high refractive index lens layer HRL is 15.5 um. Optionally, a thickness of the low refractive index modulation layer LRL is in a range of 2.2 um to 100 um, e.g., 2.2 um to 20 um, 20 um to 40 um, 40 um to 60 um, 60 um to 80 um, and 80 um to 100 um, for example, the thickness of the low refractive index modulation layer LRL is 8 um. Optionally, a thickness of the intermediate refractive index lens layer IRL is in a range of 2.2 um to 100 um, e.g., 2.2 um to 20 um, 20 um to 40 um, 40 um to 60 um, 60 um to 80 um, and 80 um to 100 um, for example, the thickness of the low refractive index modulation layer LRL is 6.5 um.

Optionally, the intermediate refractive index lens layer IRL and the high refractive index lens layer HRL are in direct contact. Optionally, the intermediate refractive index lens layer IRL and the low refractive index modulation layer LRL are in direct contact.

Various appropriate material may be used for forming the intermediate refractive index lens layer. Examples of materials suitable for forming the intermediate refractive index lens layer include, but are not limited to, thermosetting resin, phenolic resin, polydimethylsiloxane (PDMS), polyethylene naphthalate (PEN), polyimide (PI), polyetherimide (PEI), polyparaphenylene ethylene glycolate (PET), polyphenylene sulfide (PPS), oxides doped with IZO, IGZO, $AL_2O_3$, organic-inorganic hybrid molecular composite, silsesquioxane-polyurethane and its derivatives, and resin doped with SiNx and SiOxNy.

Figure 18A:
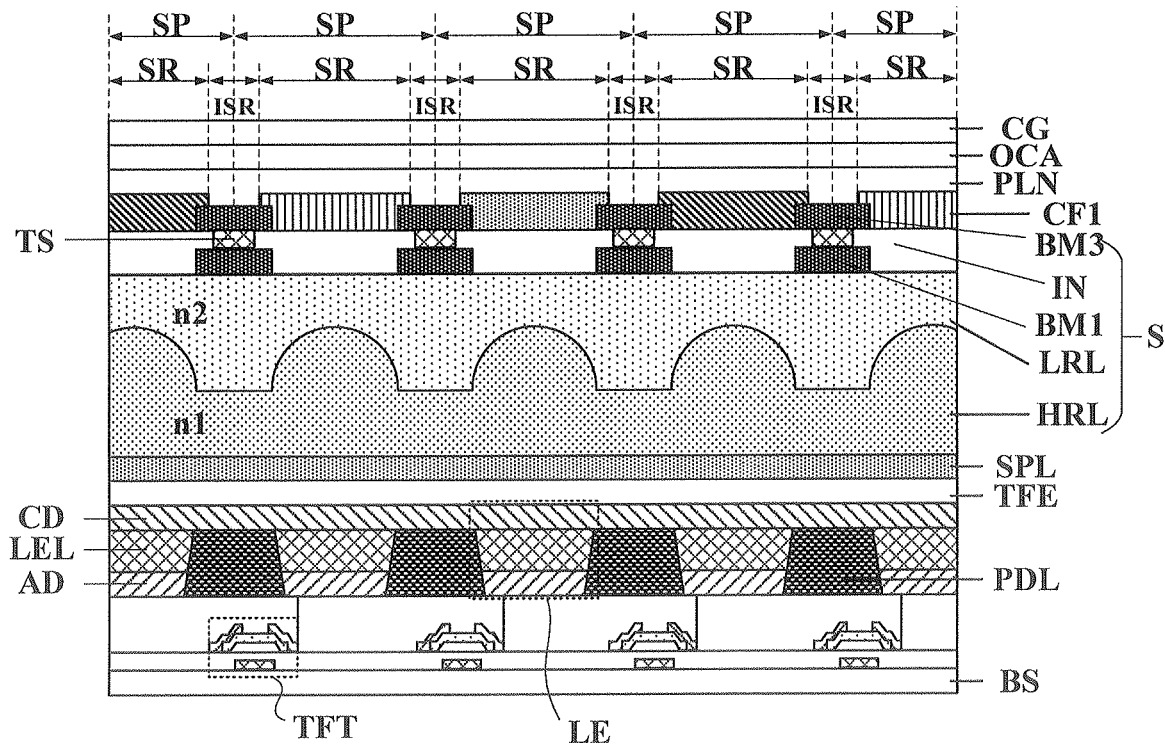
FIG. 18A is a schematic diagram of a structure of a display panel in some embodiments according to the present disclosure.
Figure 18B:
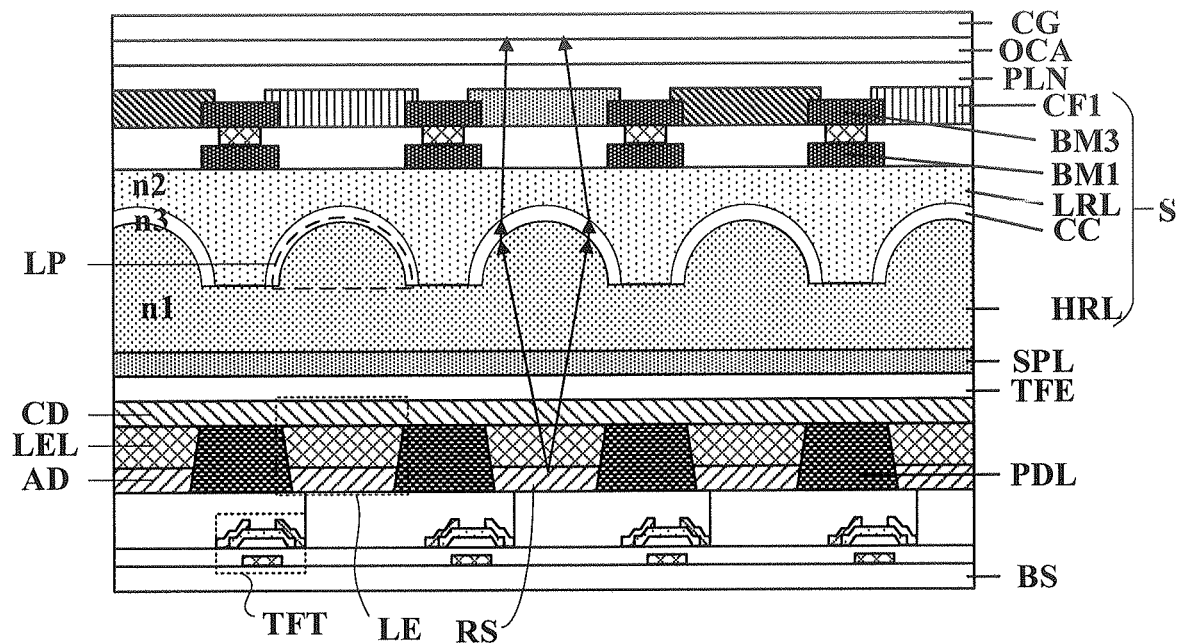
FIG. 18B is a schematic diagram of a structure of a display panel in some embodiments according to the present disclosure.
Figure 18C:
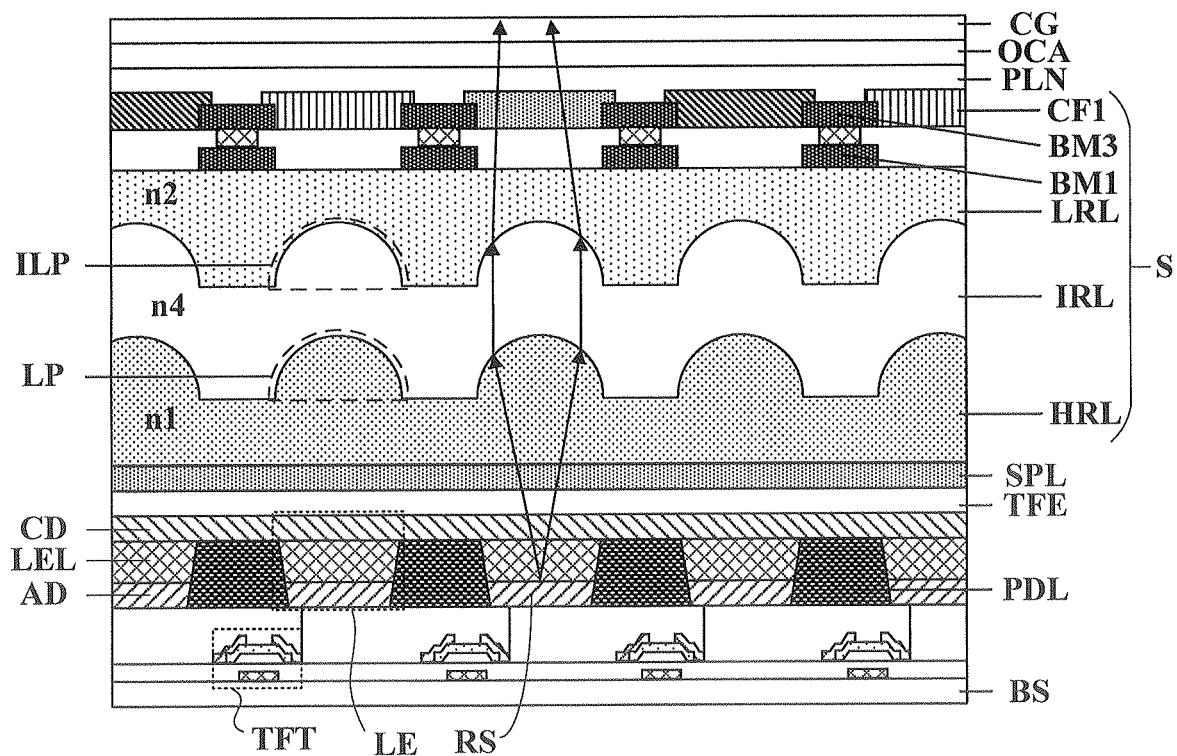
FIG. 18C is a schematic diagram of a structure of a display panel in some embodiments according to the present disclosure.

FIG. 18A to FIG. 18C are schematic diagrams of a structure of a display panel in some embodiments according to the present disclosure. In some embodiments, referring to FIG. 18A to FIG. 18C, the display panel further includes a third black matrix layer BM3 in the inter-subpixel region ISR, and spaced apart from the low refractive index modulation layer LRL by the first black matrix layer BM1; an insulating layer IN between the third black matrix layer BM3 and the first black matrix layer BM1; and a touch structure TS in the inter-subpixel region ISR, and between the first black matrix layer BM1 and the third black matrix layer BM3.

Figure 19:
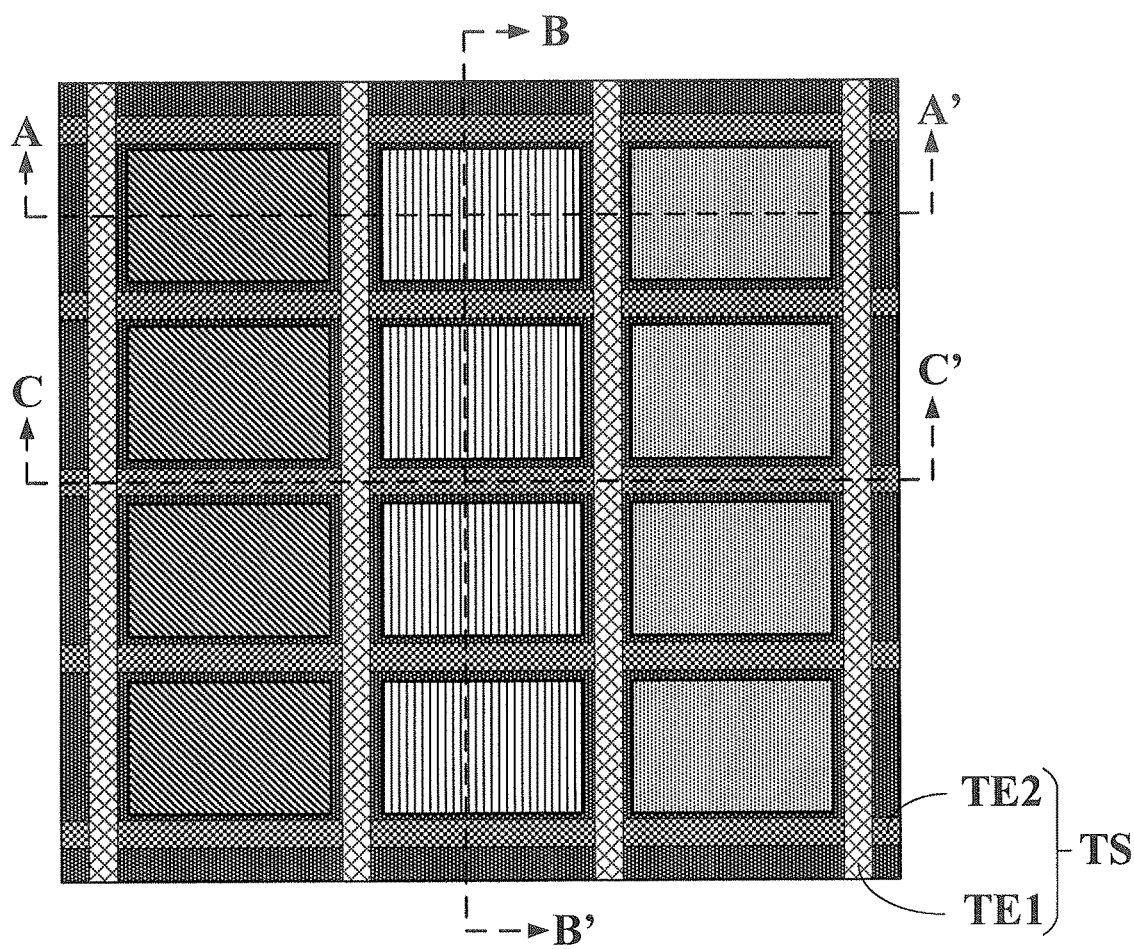
FIG. 19 is a plane view of a display panel showing a touch structure in some embodiments according to the present disclosure.
Figure 20:
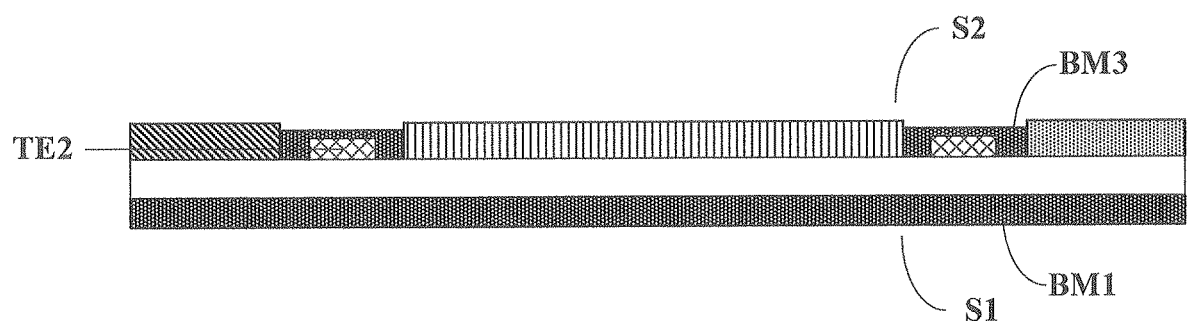
FIG. 20 is a cross-sectional view of a touch structure along an AA' line in some embodiments according to the present disclosure.
Figure 21:
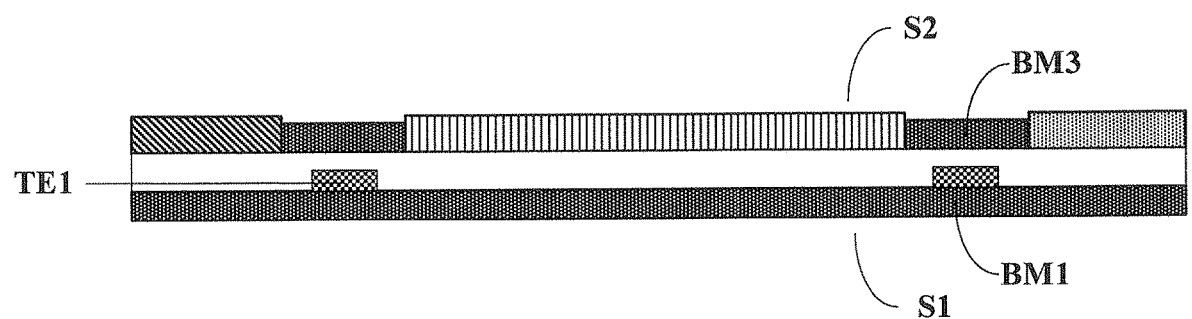
FIG. 21 is a cross-sectional view of a touch structure along a BB' line in some embodiments according to the present disclosure.
Figure 22:
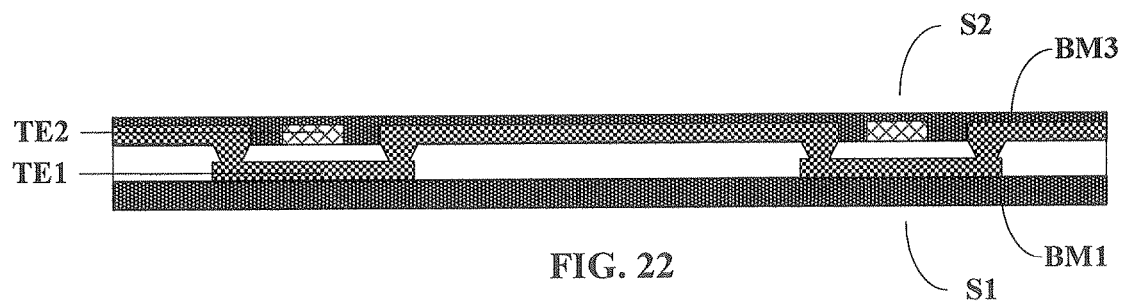
FIG. 22 is a cross-sectional view of a touch structure along a CC' line in some embodiments according to the present disclosure.

FIG. 19 is a plane view of a display panel showing a touch structure in some embodiments according to the present disclosure. FIG. 20 is a cross-sectional view of a touch structure along an AA' line in some embodiments according to the present disclosure. FIG. 21 is a cross-sectional view of a touch structure along a BB' line in some embodiments according to the present disclosure. FIG. 22 is a cross-sectional view of a touch structure along a CC' line in some embodiments according to the present disclosure. In some embodiments, referring to FIG. 19 to FIG. 22, the touch structure TS includes a plurality of first touch electrode TE1, and a plurality of second touch electrode TE2. Optionally, the plurality of first touch electrode TE1, and the plurality of second touch electrode TE2 crosses over each other. For example, the plurality of first touch electrodes TE1 are configured to transmit scanning signals, and the plurality of second touch electrodes TE2 are configured to transmit touch signals.

Optionally, on a first side S1 of the touch structure TS, the touch structure TS is covered by the first black matrix layer BM1, and on a second side S2 of the touch structure opposite to the first side, the touch structure TS is covered by the third black matrix layer BM3.

In another aspect, the present disclosure also provides a display apparatus. In some embodiments, the display apparatus includes the display panel described herein, and one or more integrated circuit connected to the display panel.

In another aspect, the present disclosure also provides a method of fabricating a display panel. In some embodiments, the method of fabricating the display panel includes forming a plurality of light emitting elements on a base substrate and respectively in a plurality of subpixels; and forming a color breakup-prevention structure configured to reduce color breakup of reflection of ambient light in the plurality of subpixels.

Optionally, forming the color breakup-prevention structure includes forming a high refractive index lens layer on a side of the plurality of light emitting elements away from the base substrate; forming a low refractive index modulation layer on a side of the high refractive index lens layer away from the base substrate; forming a first color filter layer in a subpixel region, and spaced apart from the high refractive index lens layer by the low refractive index modulation layer; and forming a first black matrix layer in an inter-subpixel region, and spaced apart from the high refractive index lens layer by the low refractive index modulation layer.

Optionally, the high refractive index lens layer has a first refractive index. Optionally, the low refractive index modulation layer has a second refractive index smaller than the first refractive index. Optionally, the low refractive index modulation layer is substantially transparent and substantially free of a chromogenic material.

Optionally, forming the high refractive index lens layer includes forming a plurality of lens portions spaced apart from each other and respectively in the plurality of subpixels.

In some embodiments, forming the color breakup-prevention structure further includes forming a second color filter layer in the subpixel region, and spaced apart from the low refractive index modulation layer by the high refractive index lens layer; and forming a second black matrix layer in the inter-subpixel region, and spaced apart from the low refractive index modulation layer by the high refractive index lens layer.

In some embodiments, the method of fabricating the display panel further includes forming an encapsulating layer encapsulating the plurality of light emitting elements; and forming a spacing planarization layer on a side of the encapsulating layer away from the plurality of light emitting elements. Optionally, the high refractive index lens layer is spaced part from the plurality of light emitting elements by the spacing planarization layer and the encapsulating layer.

In some embodiments, the method of fabricating the display panel further includes forming a pixel definition layer defining a plurality of subpixel apertures respectively in a plurality of subpixels. Optionally, the pixel definition layer is made of a light absorbing material.

In some embodiments, forming the color breakup-prevention structure further includes forming a plurality of cavity chambers spaced apart from each other, and respectively covering the plurality of lens portions. Optionally, a respective one of the plurality of cavity chambers spaces apart a respective one of the plurality of lens portions from the low refractive index modulation layer. Optionally, the respective one of the plurality of cavity chambers has a third refractive index smaller than the second refractive index.

In some embodiments, prior to forming the low refractive index modulation layer, forming the color breakup-prevention structure further includes forming an intermediate refractive index lens layer on a side of the high refractive index lens layer closer to the low refractive index modulation layer. Optionally, forming the intermediate refractive index lens layer includes forming a plurality of intermediate lens portions spaced apart from each other and respectively in the plurality of subpixels. Optionally, the intermediate refractive index lens layer has a fourth refractive index between the first refractive index and the second refractive index.

In some embodiments, the intermediate refractive index lens layer and the high refractive index lens layer are in direct contact.

In some embodiments, forming the first color filter layer includes forming a plurality of color filter blocks respectively in the plurality of subpixels. Optionally, a respective one of the plurality of color filter blocks is formed to have a light transmissive portion surrounded by the first black matrix layer. Optionally, in a cross-section intersecting a respective one of the plurality of lens portions and a respective one of the plurality of color filter blocks in a same subpixel, the light transmissive portion has a first width w1, the respective one of the plurality of lens portions has a diameter w2 and a height h, w2>w1, and 0.5 w2<h<w2.

In some embodiments, the first refractive index is 1.85, and the second refractive index is 1.18. Optionally, the third refractive index is 1.0.

In some embodiments, the method of fabricating the display panel includes forming an insulating layer on a side of the first black matrix layer away from the low refractive index modulation layer; forming the third black matrix layer on a side of the insulating layer in the inter-subpixel region, and spaced apart from the low refractive index modulation layer by the first black matrix layer.

Optionally, prior to forming the third black matrix layer, a touch structure is formed on a side of the first black matrix layer away from the low refractive index modulation layer, and in the inter-subpixel region. For example, the touch structure is formed between the first black matrix layer and the third black matrix layer. On a first side of the touch structure closer to the low refractive modulation layer, the touch structure is covered by the first black matrix layer, and on a second side of the touch structure opposite to the first side, the touch structure is covered by the third black matrix layer.

Optionally, forming the touch structure includes forming a plurality of first touch electrodes and forming a plurality of second touch electrodes crossing over the plurality of first touch electrodes. Optionally, the insulating layer is formed between the plurality of first touch electrodes and the plurality of second touch electrodes.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A method of reducing color breakup of reflection of ambient light in a display panel;
wherein the display panel comprises:
a base substrate;
a plurality of light emitting elements on the base substrate and respectively in a plurality of subpixels; and
a color breakup-prevention structure configured to reduce color breakup of reflection of ambient light in the plurality of subpixels;

wherein the color breakup-prevention structure comprises:
a high refractive index lens layer on a side of the plurality of light emitting elements away from the base substrate;
a low refractive index modulation layer on a side of the high refractive index lens layer away from the base substrate;
a first color filter layer in a plurality of subpixel regions, and spaced apart from the high refractive index lens layer by the low refractive index modulation layer; and
a first black matrix layer in an inter-subpixel region, and spaced apart from the high refractive index lens layer by the low refractive index modulation layer;
wherein the high refractive index lens layer has a first refractive index;
the low refractive index modulation layer has a second refractive index smaller than the first refractive index;
the low refractive index modulation layer is substantially transparent and substantially free of a chromogenic material; and
the high refractive index lens layer comprises a plurality of lens portions spaced apart from each other and respectively in the plurality of subpixels;
wherein the method of reducing color breakup of reflection of ambient light comprises:
refracting a first incident ambient light beam at a first interface between a respective one of the plurality of lens portions and a first medium on a side of the respective one of the plurality of lens portions away from the respective one of the plurality of light emitting elements, to generate a first refracted light beam having a direction altered from a direction of a light beam in the first medium;
reflecting the first refracted light beam by a reflective structure in a respective one of the plurality of light emitting elements to generate a first reflected light beam to continue transmitting through at least the first medium, resulting in a first residual portion arriving at the first black matrix layer; and
at least partially absorbing the first residual portion of the first reflected light beam by the first black matrix layer;
wherein the method further comprises:
refracting a second incident ambient light beam at the first interface, to generate a second refracted light beam having a direction altered from the direction of the light beam in the first medium;
reflecting the second refracted light beam by the reflective structure in the respective one of the plurality of light emitting elements to generate a second reflected light beam to continue transmitting through at least the first medium, resulting in a second residual portion arriving at the first color filter layer in a first adjacent subpixel adjacent to a subpixel having the respective one of the plurality of light emitting elements; and
at least partially absorbing the second residual portion of the second reflected light beam by the first color filter layer in the first adjacent subpixel;
wherein the first color filter layer in the first adjacent subpixel has a color different from a color of the first color filter layer in the subpixel having the respective one of the plurality of light emitting elements;
wherein the color breakup-prevention structure comprises:
a second color filter layer in the plurality of subpixel regions, and spaced apart from the low refractive index modulation layer by the high refractive index lens layer; and
a second black matrix layer in the inter-subpixel region, and spaced apart from the low refractive index modulation layer by the high refractive index lens layer;
wherein the method further comprises:
refracting a third incident ambient light beam at an interface between the high refractive index lens layer and the first medium, to generate a third refracted light beam having a direction altered from the direction of the light beam in the first medium;
at least partially absorbing the third refracted light beam by the second color filter layer in the subpixel having the respective one of the plurality of light emitting elements;
reflecting the third refracted light beam by the reflective structure in the respective one of the plurality of light emitting elements to generate a third reflected light beam, the third reflected light beam transmitting along a direction toward a second adjacent subpixel adjacent to the subpixel having the respective one of the plurality of light emitting elements; and
at least partially absorbing the third reflected light beam by the second color filter layer in the subpixel having the respective one of the plurality of light emitting elements;
wherein the first color filter layer in the second adjacent subpixel has a color different from a color of the second color filter layer in the subpixel having the respective one of the plurality of light emitting elements.

2. The method of claim 1, further comprising reflecting a fourth incident ambient light beam at the first interface to generate a fourth reflected light beam, the fourth reflected light beam transmitting along a direction toward the first black matrix layer; and
at least partially absorbing the fourth reflected light beam by the first black matrix layer.

3. The method of claim 2, further comprising reflecting a fifth incident ambient light beam at the first interface to generate a fifth reflected light beam, the fifth reflected light beam transmitting along a direction toward the first color filter layer in a third adjacent subpixel adjacent to the subpixel having the respective one of the plurality of light emitting elements; and
at least partially absorbing the fifth reflected light beam by the first color filter layer in the third adjacent subpixel;
wherein the first color filter layer in the third adjacent subpixel has a color different from a color of the first color filter layer in the subpixel having the respective one of the plurality of light emitting elements.

4. The method of claim 1, further comprising:
emitting a light beam from the respective one of the plurality of light emitting elements away from the base substrate and toward the color filter layer; and
converging the light beam by at least the respective one of the plurality of lens portions, thereby enhancing light extraction efficiency of the display panel.

5. The method of claim 1, further comprising:
refracting a sixth incident ambient light beam at the first interface to generate a fourth refracted light beam, the fourth refracted light beam transmitting along a direction toward a pixel definition layer defining a plurality of subpixel apertures respectively in a plurality of subpixels; and at least partially absorbing the fourth refracted light beam by the pixel definition layer;

wherein the pixel definition layer is made of a light absorbing material.

6. The method of claim 1, prior to refracting the first incident ambient light beam at the first interface, further comprising refracting an incident ambient light beam at a second interface between a respective one of a plurality of cavity chambers and a second medium on a side of the respective one of the plurality of cavity chambers away from the respective one of the plurality of lens portions to generate the first incident ambient light beam;

wherein the plurality of cavity chambers are spaced apart from each other, and respectively cover the plurality of lens portions;

the respective one of the plurality of cavity chambers spaces apart the respective one of the plurality of lens portions from the low refractive index modulation layer; and the respective one of the plurality of cavity chambers has a third refractive index smaller than the second refractive index.

7. The method of claim 1, prior to refracting the first incident ambient light beam at the first interface, further comprising refracting an incident ambient light beam at a third interface between a respective one of a plurality of intermediate lens portions and a third medium on a side of the respective one of the plurality of intermediate lens portions away from the respective one of the plurality of lens portions, to generate the first incident ambient light beam;

wherein an intermediate refractive index lens layer comprising the plurality of intermediate lens portions is between the high refractive index lens layer and the low refractive index modulation layer;

the intermediate refractive index lens layer comprises the plurality of intermediate lens portions spaced apart from each other and respectively in the plurality of subpixels; and the intermediate refractive index lens layer has a fourth refractive index between the first refractive index and the second refractive index.

8. A display panel, comprising:

a base substrate;

a plurality of light emitting elements on the base substrate and respectively in a plurality of subpixels; and a color breakup-prevention structure configured to reduce color breakup of reflection of ambient light in the plurality of subpixels;

wherein the color breakup-prevention structure comprises:

a high refractive index lens layer on a side of the plurality of light emitting elements away from the base substrate;

a low refractive index modulation layer on a side of the high refractive index lens layer away from the base substrate;

a first color filter layer in a subpixel region, and spaced apart from the high refractive index lens layer by the low refractive index modulation layer; and a first black matrix layer in an inter-subpixel region, and spaced apart from the high refractive index lens layer by the low refractive index modulation layer;

wherein the high refractive index lens layer has a first refractive index;

the low refractive index modulation layer has a second refractive index smaller than the first refractive index;

the low refractive index modulation layer is substantially transparent and substantially free of a chromogenic material; and the high refractive index lens layer comprises a plurality of lens portions spaced apart from each other and respectively in the plurality of subpixels;

wherein the color breakup-prevention structure further comprises:

a second color filter layer in the subpixel region, and spaced apart from the low refractive index modulation layer by the high refractive index lens layer; and a second black matrix layer in the inter-subpixel region, and spaced apart from the low refractive index modulation layer by the high refractive index lens layer.

9. The display panel of claim 8, further comprising:

an encapsulating layer encapsulating the plurality of light emitting elements; and a spacing planarization layer on a side of the encapsulating layer away from the plurality of light emitting elements;

wherein the high refractive index lens layer is spaced part from the plurality of light emitting elements by the spacing planarization layer and the encapsulating layer.

10. The display panel of claim 8, further comprising a pixel definition layer defining a plurality of subpixel apertures respectively in a plurality of subpixels;

wherein the pixel definition layer is made of a light absorbing material.

11. The display panel of claim 8, wherein the color breakup-prevention structure further comprises a plurality of cavity chambers spaced apart from each other, and respectively covering the plurality of lens portions;

wherein a respective one of the plurality of cavity chambers spaces apart a respective one of the plurality of lens portions from the low refractive index modulation layer; and the respective one of the plurality of cavity chambers has a third refractive index smaller than the second refractive index.

12. The display panel of claim 8, wherein the color breakup-prevention structure further comprises an intermediate refractive index lens layer between the high refractive index lens layer and the low refractive index modulation layer;

wherein the intermediate refractive index lens layer comprises a plurality of intermediate lens portions spaced apart from each other and respectively in the plurality of subpixels; and the intermediate refractive index lens layer has a fourth refractive index between the first refractive index and the second refractive index.

13. The display panel of claim 12, wherein the intermediate refractive index lens layer and the high refractive index lens layer are in direct contact.

14. The display panel of claim 8, wherein the first color filter layer comprises a plurality of color filter blocks respectively in the plurality of subpixels; and a respective one of the plurality of color filter blocks has a light transmissive portion surrounded by the first black matrix layer;

wherein, in a cross-section intersecting a respective one of the plurality of lens portions and a respective one of the plurality of color filter blocks in a same subpixel, the light transmissive portion has a first width $w1$, the respective one of the plurality of lens portions has a diameter $w2$ and a height $h$, $w2>w1$, and $0.5\,w2<h<w2$.

15. The display panel of claim 8, wherein the first refractive index is 1.85, and the second refractive index is 1.18.

16. The display panel of claim 8, further comprising:
a third black matrix layer in the inter-subpixel region, and spaced apart from the low refractive index modulation layer by the first black matrix layer;
an insulating layer between the third black matrix layer and the first black matrix layer; and
a touch structure in the inter-subpixel region, and between the first black matrix layer and the third black matrix layer;
wherein on a first side of the touch structure, the touch structure is covered by the first black matrix layer, and on a second side of the touch structure opposite to the first side, the touch structure is covered by the third black matrix layer; and
the touch structure comprises a plurality of first touch electrodes and a plurality of second touch electrode crossing over each other.

17. A display apparatus, comprising the display panel of claim 8, and one or more integrated circuit connected to the display panel.

18. A method of fabricating a display panel, comprising:
forming a plurality of light emitting elements on a base substrate and respectively in a plurality of subpixels; and
forming a color breakup-prevention structure configured to reduce color breakup of reflection of ambient light in the plurality of subpixels;
wherein forming the color breakup-prevention structure comprises:
forming a high refractive index lens layer on a side of the plurality of light emitting elements away from the base substrate;
forming a low refractive index modulation layer on a side of the high refractive index lens layer away from the base substrate;
forming a first color filter layer in a subpixel region, and spaced apart from the high refractive index lens layer by the low refractive index modulation layer; and
forming a first black matrix layer in an inter-subpixel region, and spaced apart from the high refractive index lens layer by the low refractive index modulation layer;
wherein the high refractive index lens layer has a first refractive index;
the low refractive index modulation layer has a second refractive index smaller than the first refractive index;
the low refractive index modulation layer is substantially transparent and substantially free of a chromogenic material; and
forming the high refractive index lens layer comprises forming a plurality of lens portions spaced apart from each other and respectively in the plurality of subpixels;
wherein forming the color breakup-prevention structure further comprises:
forming a second color filter layer in the subpixel region, and spaced apart from the low refractive index modulation layer by the high refractive index lens layer; and
forming a second black matrix layer in the inter-subpixel region, and spaced apart from the low refractive index modulation layer by the high refractive index lens layer.

* * * * *